(12) United States Patent
Lee et al.

(10) Patent No.: US 8,076,713 B2
(45) Date of Patent: *Dec. 13, 2011

(54) NON-VOLATILE MEMORY DEVICES HAVING A MULTI-LAYERED CHARGE STORAGE LAYER

(75) Inventors: Chang-Hyun Lee, Gyeonggi-do (KR); Kyu-Charn Park, Gyeonggi-do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 157 days.

This patent is subject to a terminal disclaimer.

(21) Appl. No.: 12/422,862

(22) Filed: Apr. 13, 2009

(65) Prior Publication Data

US 2009/0250747 A1    Oct. 8, 2009

Related U.S. Application Data

(62) Division of application No. 11/799,685, filed on May 2, 2007, now Pat. No. 7,534,684, which is a division of application No. 10/975,933, filed on Oct. 28, 2004, now Pat. No. 7,230,294.

(30) Foreign Application Priority Data

Oct. 28, 2003  (KR) .................. 10-2003-0075516

(51) Int. Cl.
*H01L 21/8247* (2006.01)

(52) U.S. Cl. ............... 257/321; 257/326; 257/E21.685; 257/E21.686; 257/E21.687; 257/E21.688

(58) Field of Classification Search .................. 257/321, 257/326, E21.685, E21.686, E21.687, E21.688, 257/E21.69; 438/258, 261, 264, 591, 594
See application file for complete search history.

(56) References Cited

U.S. PATENT DOCUMENTS

| | | | |
|---|---|---|---|
| 6,844,590 B2 | 1/2005 | Goda et al. | |
| 7,399,672 B2 | 7/2008 | Lee et al. | |
| 2003/0030097 A1* | 2/2003 | Lee et al. | 257/314 |
| 2004/0082198 A1 | 4/2004 | Nakamura et al. | |
| 2006/0008959 A1 | 1/2006 | Hagemeyer et al. | |
| 2006/0208338 A1 | 9/2006 | Lee et al. | |
| 2006/0261398 A1* | 11/2006 | Lee | 257/314 |
| 2008/0079056 A1* | 4/2008 | Cha et al. | 257/314 |
| 2008/0081418 A1 | 4/2008 | Park | |
| 2008/0093663 A1* | 4/2008 | Lee et al. | 257/324 |
| 2008/0237700 A1* | 10/2008 | Kim et al. | 257/326 |
| 2008/0246073 A1* | 10/2008 | Lee et al. | 257/314 |
| 2008/0285344 A1* | 11/2008 | Ruttkowski et al. | 365/185.05 |

FOREIGN PATENT DOCUMENTS

| | | |
|---|---|---|
| JP | 11-224940 | 8/1999 |
| JP | 11-238814 | 8/1999 |
| JP | 2003-078043 | 3/2003 |
| JP | 2003-086766 | 3/2003 |
| JP | 2005-116551 | 4/2005 |

* cited by examiner

*Primary Examiner* — George Fourson
(74) *Attorney, Agent, or Firm* — Myers Bigel Sibley & Sajovec

(57) ABSTRACT

A non-volatile memory device includes a substrate having a first region and a second region. A first gate electrode is disposed on the first region. A multi-layered charge storage layer is interposed between the first gate electrode and the substrate, the multi-layered charge storage including a tunnel insulation, a trap insulation, and a blocking insulation layer which are sequentially stacked. A second gate electrode is placed on the substrate of the second region, the second gate electrode including a lower gate and an upper gate connected to a region of an upper surface of the lower gate. A gate insulation layer is interposed between the second gate electrode and the substrate. The first gate electrode and the upper gate of the second gate electrode comprise a same material.

18 Claims, 18 Drawing Sheets

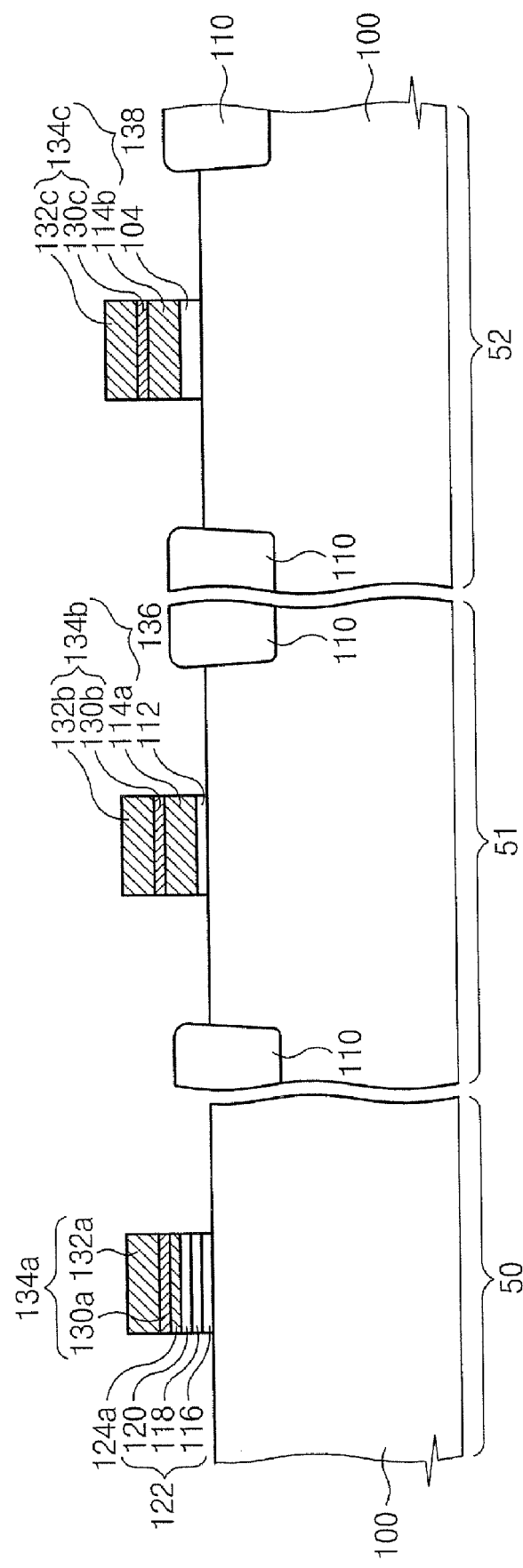

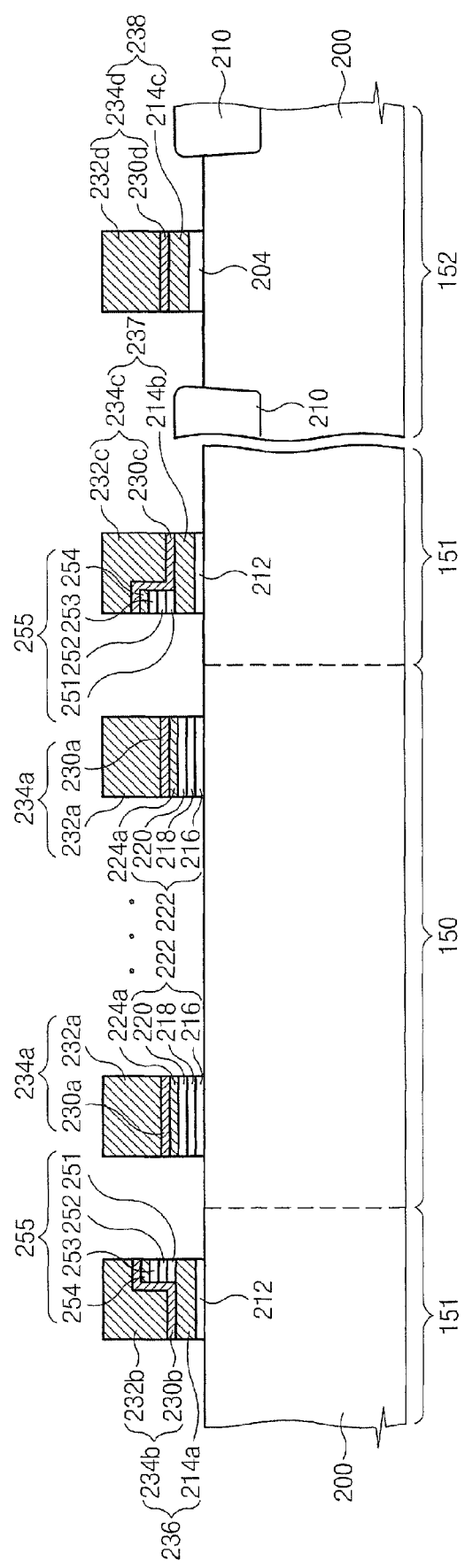

NON-VOLATILE MEMORY DEVICES HAVING A MULTI-LAYERED CHARGE STORAGE LAYER

RELATED APPLICATION

The present application is a Divisional Application of U.S. patent application Ser. No. 11/799,685, filed in the United States Patent Office on May 2, 2007, now U.S. Pat. No. 7,534,684 which is a Divisional Application of U.S. patent application Ser. No. 10/975,933, filed in the United States Patent Office on Oct. 28, 2004, now U.S. Pat. No. 7,230,294 and claims priority to Korean Patent Application No. 2003-0075516, filed in the Korean Intellectual Property Office on Oct. 28, 2003, the disclosures of which are incorporated herein by reference.

FIELD OF THE INVENTION

The present invention relates to semiconductor devices and methods of forming the same, and, more particularly to non-volatile memory devices and methods of forming the same.

BACKGROUND OF THE INVENTION

Non-volatile memory devices are capable of storing data even when the power is turned off. Because of this characteristic, non-volatile memories may be used in a wide variety of applications in new portable storage media. FLASH memory devices having a floating gate have been widely used in a field of non-volatile memory devices. Specifically, FLASH memory devices with a stacked gate structure have been used because they may be formed using a relatively simple process. A unit cell of a FLASH memory device with a stacked gate structure may comprise a sequentially stacked structure including a tunnel oxide layer, a floating gate, a gate interlayer dielectric layer, and a control gate electrode. The unit cell may further comprise source/drain regions that are arranged in a substrate at both sides of the floating gate. The floating gate is electrically isolated. The data stored in the FLASH memory cell may be a logic "1" or "0" depending on charges in the floating gate.

Charges in the floating gate are stored in a "free-charge" state. Accordingly, if a tunnel oxide layer under the floating gate is partially damaged, then all charges stored in the floating gate may be lost. For this reason, a FLASH memory cell having a floating gate may require a tunnel oxide layer with sufficient thickness.

If the thickness of the tunnel oxide layer increases, a reliability of the FLASH memory cell may be improved, however, an operation voltage may increase. As a result, a peripheral circuit part (for controlling high voltage) of the FLASH memory device may become more complex. Second, power consumption of the FLASH memory device may increase. Third, an operation speed of the FLASH memory device may decrease. To overcome one or more of these problems, a MONOS (Metal-Oxide-Nitride-Oxide-Silicon) configuration has been suggested.

A general MONOS memory cell is disclosed in U.S. Pat. No. 6,103,572. According to FIG. 23 of the U.S. Pat. No. 6,103,572, the MONOS memory cell includes a tunnel oxide layer, a silicon nitride layer, a top oxide film and a gate electrode, which are stacked sequentially on a substrate. High-concentration diffusion regions are placed in the substrate at both sides of the gate electrode, respectively. The high-concentration diffusion regions correspond to source/drain regions.

The MONOS memory cell stores charges in the silicon nitride layer. In other words, the silicon nitride layer has deep level traps, and charges are stored in the deep level traps. Accordingly, even if the tunnel oxide layer is partially damaged, the MONOS memory cell may lose a part of the charges in the silicon nitride layer. Therefore, it is possible to form a tunnel oxide layer thinner than the FLASH memory cell having the floating gate. As a result, the MONOS memory cell uses a relatively low operation voltage in comparison with the FLASH memory cell. That is, in comparison with the FLASH memory cell, the MONOS memory cell may have lower power consumption and improved operation speed.

In another approach, even if the MONOS memory cell uses a relatively low operation voltage as compared to the FLASH memory cell, it uses high operation voltages rather than the power voltage. Accordingly, a MONOS memory device having a MONOS memory cell typically has a high-voltage MOS transistor (hereinafter referred to as a high-voltage transistor). In addition, the MONOS memory device may include a low-voltage MOS transistor (hereinafter referred to as a low-voltage transistor) where a low voltage is applied. The low and high voltage transistors may require a gate insulation layer different from a gate insulation layer of associated with the three-layered structure of the MONOS memory cell (e.g., a tunnel oxide layer, a silicon nitride layer and a top oxide layer). The reason for this is that if the gate insulation layer with the three-layered structure is used as a gate oxide layer of the low and high voltage transistors, problems may exist with the low and high voltage transistors. For instance, in the low and high voltage transistors, a threshold voltage of the low-voltage transistor may be changed by soft programming. As a result, various turn-on currents of the low-voltage transistor may induce leakage current.

SUMMARY OF THE INVENTION

According to some embodiments of the present invention, a non-volatile memory device includes a substrate having a first region and a second region. A first gate electrode is disposed on the first region. A multi-layered charge storage layer is interposed between the first gate electrode and the substrate, the multi-layered charge storage including a tunnel insulation, a trap insulation, and a blocking insulation layer which are sequentially stacked. A second gate electrode is placed on the substrate of the second region, the second gate electrode including a lower gate and an upper gate connected to a region of an upper surface of the lower gate. A gate insulation layer is interposed between the second gate electrode and the substrate. The first gate electrode and the upper gate of the second gate electrode comprise a same material.

In other embodiments, a bottom portion of the first gate electrode in contact with an upper surface of the multi-layered charge storage layer comprises a conductive material having a work function larger than n-type doped polysilicon.

In still other embodiments, a protection conductive pattern is interposed between the multi-layered charge storage layer and the first gate electrode. The protection conductive pattern comprises a conductive material having a work function greater than that of n-type doped polysilicon.

In still other embodiments, an entire upper surface of the lower gate of the second gate electrode is in contact with the upper gate of the second gate electrode.

In still other embodiments, a residual multi-layered pattern is interposed between a part of an upper surface of the lower gate of the second gate electrode and the upper gate of the second gate electrode. The residual multi-layered pattern comprises a same material as that interposed between the first gate electrode and the substrate.

In still other embodiments, sidewalls of the lower gate and the upper gate of the second gate electrode, which are respectively disposed under and on the residual multi-layered pattern, are placed on the same line vertical to a surface of the substrate.

In still other embodiments, sidewalls of the lower gate and the upper gate of the second gate electrode, respectively disposed under and on the residual multi-layered pattern, are further disposed on different vertical lines with respect to a surface of the substrate. The multi-layered charge storage layer extends along the substrate to be connected to the residual multi-layered pattern.

In still other embodiments, a protection conductive pattern is interposed between the first gate electrode and the multi-layered charge storage layer. The residual multi-layered pattern comprises a residual layer comprising a same material as the protection conductive pattern and being isolated from the protection conductive pattern. The protection conductive pattern comprises a conductive material having a work function greater than n-type doped polysilicon.

In still other embodiments, a conductive material having a work function larger than n-type doped polysilicon comprises tungsten, molybdenum, titanium nitride, tantalum nitride, tungsten nitride, titanium aluminum nitride layer($Ti_2AlN$), tungsten silicide, nickel silicide, cobalt silicide and/or titanium suicide.

In still other embodiments, the substrate further comprises a third region. A third gate electrode is placed on the substrate of the third region, the third gate electrode comprising lower and upper gates that are stacked sequentially. A thick gate insulation layer is interposed between the third gate electrode and the substrate, the thick gate insulation layer being thicker than the gate insulation layer. The upper gate of the third gate electrode and the first gate electrode comprise a same material.

In still other embodiments, the lower gate of the second gate electrode and the lower gate of the third gate electrode comprise a same material.

Although described above primarily with respect to non-volatile memory embodiments of the present invention, it will be understood that the present invention may also be embodied as methods of forming a non-volatile memory.

BRIEF DESCRIPTION OF THE DRAWINGS

Other features of the present invention will be more readily understood from the following detailed description of specific embodiments thereof when read in conjunction with the accompanying drawings, in which:

FIGS. 2-8 are sectional views that illustrate formation of a non-volatile memory device according to some embodiments of the present invention;

FIGS. 10 to 15 are sectional views that illustrate formation of a non-volatile memory device according to further embodiments of the present invention.

DETAILED DESCRIPTION

Figure 1:
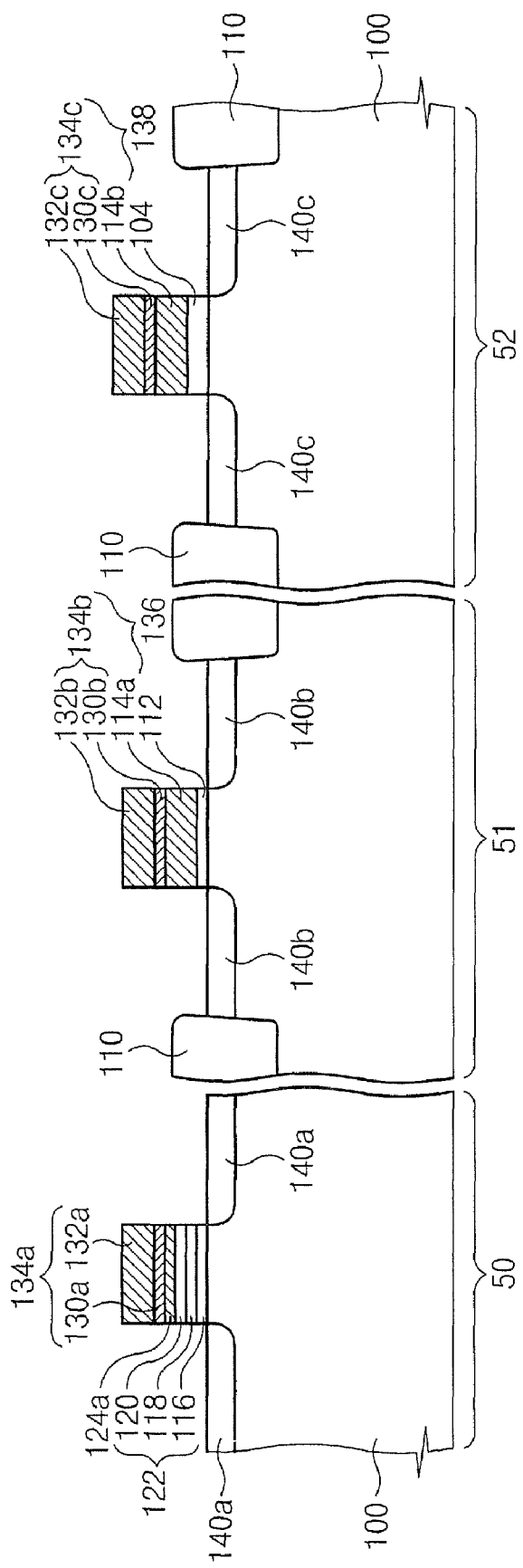
FIG. 1 is a cross-sectional view showing a non-volatile memory device according to some embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first region, layer or section discussed below could be termed a second region, layer or section, and, similarly, a second region, layer or section could be termed a first region, layer or section without departing from the teachings of the present invention.

Embodiments of the invention are described herein with reference to cross-sectional illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a contact hole illustrated as a having squared or sharp edges will, typically, have rounded or curved features rather than the exact shapes shown in the figures. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view showing a non-volatile memory device according to some embodiments of the present invention. Referring now to FIG. 1, a device isolation layer 110 is placed at a predetermined region of a substrate 100 having a cell region 50, a low-voltage region 51 and a high-voltage region 52. The device isolation layer 110 defines a cell active region, a low-voltage active region, and a high-voltage active region at the cell region 50, the low-voltage region 51 and the high-voltage region 52, respectively. The cell active region may be a line shape from a top plane view. The cell region 50 of FIG. 1 reveals a cross section of the cell active region with a line shape and the device isolation 110 is not shown therein. A non-volatile memory cell, e.g., a MONOS memory cell, is formed at the cell region 50. A low-voltage transistor is formed at the low-voltage region 51 and a high-voltage transistor is formed at the high-voltage region 52.

A cell gate electrode 134a, a low-voltage gate electrode 136, and a high-voltage gate electrode 138 cross over the cell, low-voltage, and high-voltage active regions, respectively. A multi-layered charge storage layer 122 is interposed between the cell gate electrode 134a and the cell active region. A low-voltage gate insulation layer 112 is interposed between the low-voltage gate electrode 136 and the low-voltage active region. A high-voltage gate insulation layer 104 is interposed between the high-voltage gate electrode 138 and the high-voltage active region.

The low-voltage gate insulation layer 112 may comprise a silicon oxide layer, such as a thermal oxide layer. Also, the high-voltage gate insulation layer 104 may comprise a silicon oxide layer, such as a thermal oxide layer. The high-voltage gate insulation layer 104 may be thicker than the low-voltage gate insulation layer 112. Accordingly, even if a high voltage is applied to the high-voltage gate electrode 138, it is possible to reduce degradation of the high-voltage gate insulation layer 138.

The multi-layered charge storage layer 122 comprises a tunnel insulation layer 116, a trap insulation layer 118, and a blocking insulation layer 120, which are stacked sequentially. The trap insulation layer 118 comprises an insulation layer including deep level traps capable of storing charges. For example, the trap insulation layer 118 may comprise a silicon nitride layer or a silicon oxynitride layer. If charges are stored or discharged in/from the trap insulation layer 118, data in the non-volatile memory cell is stored or erased. The tunnel insulation layer 116 where charges are tunneled may comprise a silicon oxide layer, such as a thermal oxide layer. The blocking insulation layer 120 may comprise an insulation layer for inhibiting charges from tunneling between the trap insulation layer 118 and the cell gate electrode 134a. For instance, the blocking insulation layer 120 may comprise a high k-dielectric layer having a high dielectric constant in comparison with a silicon oxide layer. Because the blocking insulation layer 120 is formed of a high k-dielectric layer, the coupling ratio of the non-volatile memory cell may increase. As a result, it is possible to reduce the operation voltage of the non-volatile memory cell. The blocking insulation layer 120 may comprise a metal oxide layer having a high dielectric constant, such as an aluminum oxide layer or a hafnium oxide layer. The blocking insulation layer 120 may comprise a silicon oxide layer having a thickness greater than that of the tunnel insulation layer 116.

The low-voltage gate electrode 136 comprises a lower low-voltage gate 114a and an upper low-voltage gate 134b, which are stacked sequentially. The high-voltage gate electrode 138 comprises a lower high-voltage gate 114b and an upper high-voltage gate 134c, which are stacked sequentially. The upper low-voltage gate 143b, the upper high-voltage gate 143c, and the cell gate electrode 134a may comprise the same material. In addition, the lower low-voltage gate 114a and the lower high-voltage gate 114b may comprise the same material.

The cell gate electrode 134a may comprise a cell subsidiary conductive pattern 130a and a cell main conductive pattern 132a. The cell gate electrode 143a may comprise only the cell main conductive pattern 132a without the cell subsidiary conductive pattern 130a. If the cell gate electrode 134a comprises the cell subsidiary conductive pattern 130a and the cell main conductive pattern 132a, then the upper low-voltage gate 134b comprises a low-voltage subsidiary conductive pattern 130b and a low-voltage main subsidiary pattern 132b, which are sequentially stacked, and the upper high-voltage gate 134c comprises a high-voltage subsidiary pattern 130c and a high-voltage main conductive pattern 132c. If the cell gate electrode 134a comprises only the cell main conductive pattern 132a, the upper low-voltage gate and the high-voltage gate comprise the low-voltage and high-voltage main conductive patterns 132b and 132c, respectively.

The lower low-voltage gate 114a and the lower high-voltage gate 114b may comprise a doped polysilicon or a conductive metal component. The conductive metal component may comprise a metal layer, such as tungsten or molybdenum, a conductive metal nitride, such as titanium nitride, tantalum nitride, tungsten nitride and/or titanium aluminum nitride and/or a metal silicide, such as tungsten silicide.

A protection conductive pattern 124a may be interposed between the cell gate electrode 134a and the multi-layered charge storage layer 122. The protection conductive pattern 124a may reduce etch damage to the multi-layered charge storage layer 122 during a patterning process.

A high work function conductive material is in contact with an upper surface of the multi-layered charge storage layer 122 (i.e., an upper surface of the blocking insulation layer 120). The high work function conductive material has a work function greater than n-type doped polysilicon. The n-type doped polysilicon is polysilicon doped with n-type impurities. The high work function conductive material may comprise a metal layer, such as tungsten and/or molybdenum, a conductive metal nitride, such as titanium nitride, tantalum nitride, tungsten nitride and/or titanium aluminum nitride $Ti_2AlN$, and/or a metal silicide, such as tungsten silicide, titanium silicide, cobalt silicide and/or nickel silicide.

If the protection conductive pattern 124a and the cell gate electrode 134a are stacked on the multi-layered charge storage layer 122, then the protection conductive pattern 124a may comprise the high work function conductive material. In this case, all or a part of the cell gate electrode 134a may comprise the high work function conductive material. Accordingly, all or a part of the upper low-voltage and high-voltage gates 134b and 134c comprise the high work function conductive material. In other embodiments, all or a part of the cell gate electrode 134a, and the upper low-voltage and high-voltage gates 134b and 134c may comprise a doped polysilicon.

If the cell gate electrode 134a is in contact with the multi-layered charge storage layer 122, then at least a bottom portion of the cell gate electrode 134a in contact with the blocking insulation layer 120 may comprise the high work function conductive material. If the cell gate electrode 134a comprises the cell subsidiary conductive pattern 130a and the cell main conductive pattern 132a, then the cell subsidiary conductive pattern 130a comprise the high work function conductive material. The cell main conductive pattern 132a may comprise the high work function conductive material or doped polysilicon. If the cell gate electrode 134a comprises only the cell main conductive pattern 132a, then the cell main conductive pattern 132a may comprise the high work function conductive material.

Generally, charge stored in a MONOS memory cell use electrons widely because holes may more degrade a tunnel oxide layer by tunneling it in comparison with electrons. Therefore, a gate electrode of a conventional MONOS memory cell can use n-type doped polysilicon. The cell gate electrode 134a may comprise the high work function conductive material. As a result, it is possible to reduce charges tunneling between the trap insulation layer 118 and the cell gate electrode 134a. Therefore, operation speed of the non-volatile memory cell can be improved.

For example, the protection conductive pattern 124a may comprise a material protecting the multi-layered charge storage layer 122 from etch-damage and having a work function greater than n-type doped polysilicon, such as tungsten nitride, tantalum nitride and/or titanium nitride. The cell, low-voltage, and high-voltage main conductive patterns 132a, 132b and 132c may comprise a metal layer, such as tungsten or molybdenum, which are capable of reducing gate resistance. The cell, low-voltage, and high-voltage subsidiary patterns 130a, 130b and 130c may comprise a conductive nitride layer to improve an interface characteristic with the lower low-voltage and high-voltage gates 114a and 114b.

A first impurity diffusion region 140a is placed at the cell active region located at both sides of the cell gate electrode 134a. A second impurity diffusion region 140b is placed at the low-voltage active region located at both sides of the low-voltage gate electrode 136. A third impurity diffusion region 140c is placed at the high-voltage active region located at both sides of the high-voltage gate electrode 138.

A non-volatile memory cell comprises the cell gate electrode 134a, the multi-layered charge storage layer 122, and the first impurity diffusion region 140a. A low-voltage transistor comprises the low-voltage gate electrode 136, the low gate insulation layer 122, and the second impurity diffusion region 140b. A high-voltage transistor comprises the high-voltage gate 138, the high-voltage gate insulation layer 104, and the third impurity diffusion region 140b.

In a non-volatile memory device having the above structure, the non-volatile memory cell, the low-voltage transistor, and high-voltage transistor have gate insulation layers with suitable characteristics. In other words, the non-volatile memory cell has the multi-layered charge storage layer 122. The high-voltage gate insulation layer 104 is thick enough for an operation voltage of a high voltage applied to the high-voltage transistor. The low-voltage transistor has the low-voltage gate insulation layer 112 having a thickness and quality suitable for characteristics of the low-voltage transistor. As a result, it is possible to prevent degradation to various threshold voltages depending on operation time by conventional soft programming. In addition, the blocking insulation layer 120 is in contact with the high work function conductive material so that speed of erase and program operations can be improved.

The non-volatile memory device with the above-structure can be applicable to a NOR-type non-volatile memory device. In this case, the low-voltage and high-voltage transistors may be placed at a peripheral circuit part of the nor-type non-volatile memory device.

The non-volatile memory device may be applicable to a NAND-type non-volatile memory device. In the case, the low-voltage and high-voltage transistors may be placed at a peripheral circuit part of the NAND-type non-volatile memory device. Furthermore, the low-voltage transistor may be applicable to a string selection transistor or a ground selection transistor, which are located in a cell string of the NAND-type non-volatile memory device.

Figure 2:
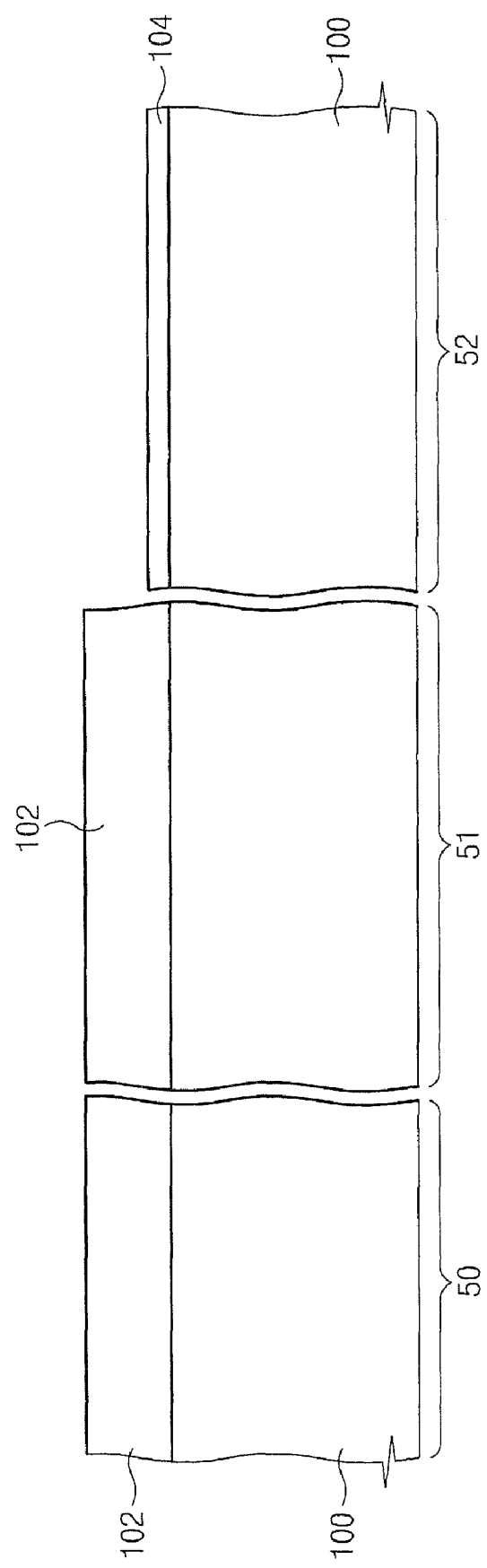

FIGS. 2 to 8 are sectional views that illustrate formation of a non-volatile memory device according to some embodiments of the present invention. Referring now to FIG. 2, an oxidation barrier layer 102 is formed on a whole surface of a substrate 100 having cell, low-voltage, and high-voltage regions 50, 51 and 52. The oxidation barrier layer 102 is patterned to expose a predetermined region of the substrate 100 of the high-voltage region 52. The substrate 100 of the cell and low-voltage regions 50 and 51 is covered with the patterned oxidation barrier layer 102. A high-voltage gate insulation layer 104 is formed on a surface of the substrate exposed by performing a first thermal oxidation process. In forming the high-voltage gate insulation layer 104, the patterned oxidation barrier layer 102 inhibits formation of a thermal oxide layer at the cell and low-voltage regions 50 and 51. The oxidation barrier layer 102 may comprise silicon nitride and/or silicon oxide/silicon nitride.

The patterned oxidation barrier layer 102 is removed from the substrate 100 having the high-voltage gate insulation layer 104. If the patterned oxidation barrier layer 102 includes a buffer oxide layer, then a surface of the high-voltage insulation layer 104 is partially recessed while the oxidation barrier layer 102 is removed. In this case, the buffer oxide layer may comprise an oxide layer having a high etching rate in comparison with the high-voltage gate insulation layer 104. Accordingly, most of the high-voltage gate insulation layer 104 may be maintained in its current state.

Figure 3:
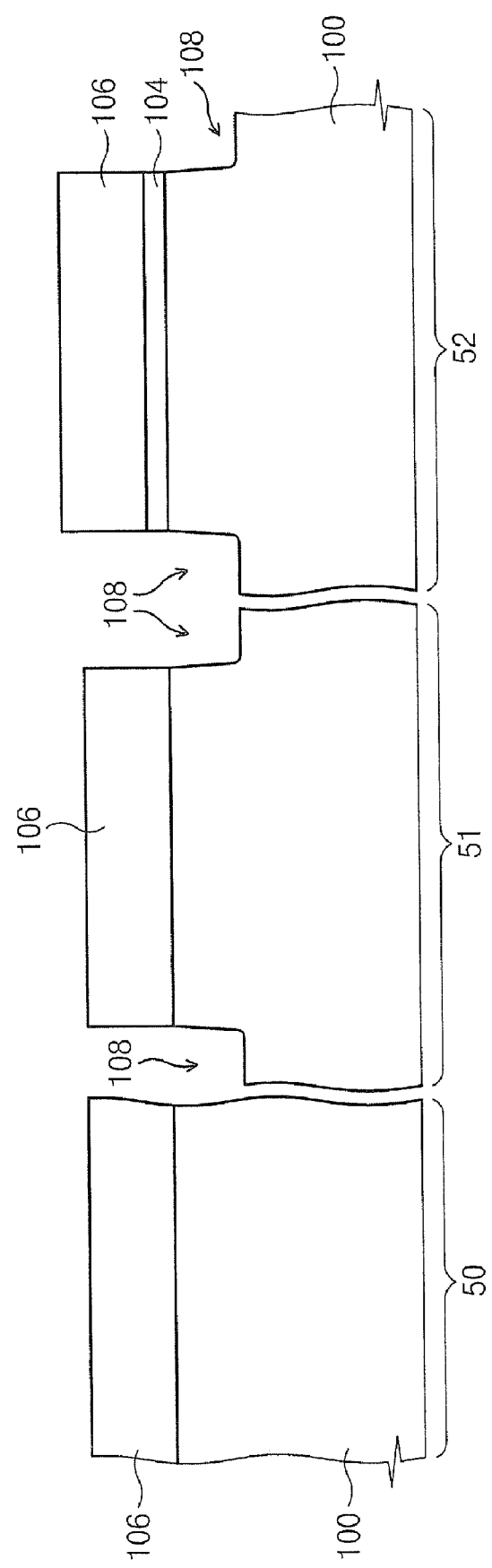
Figure 4:
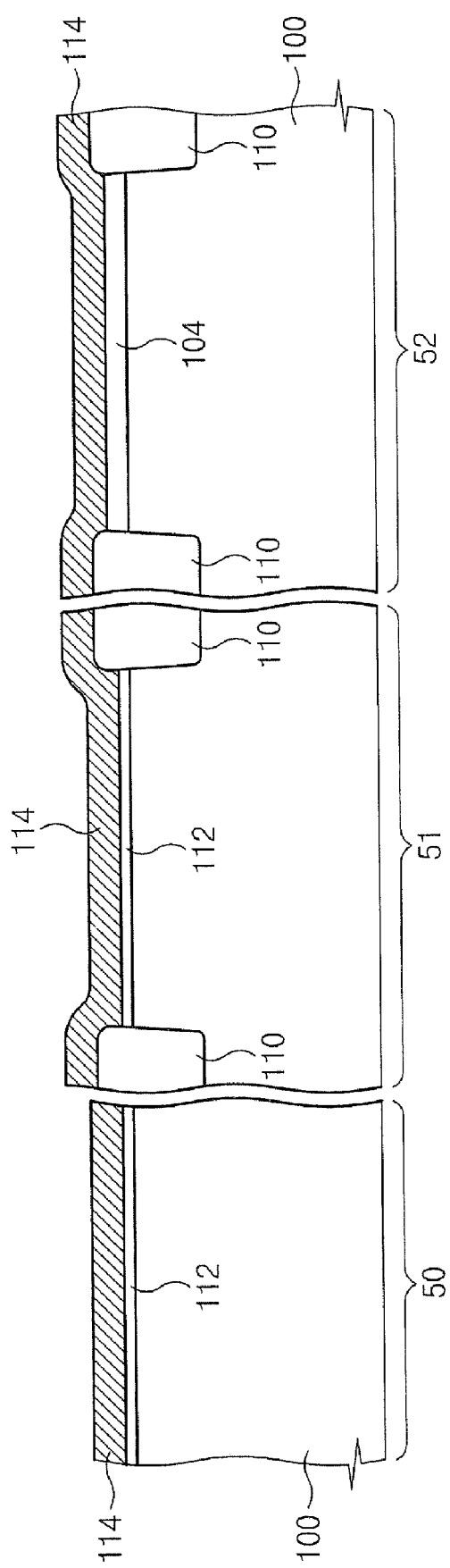

Referring to FIGS. 3 and 4, a hard mask layer 106 is formed on a surface of the substrate 100 where the patterned oxidation barrier layer 102 is removed. The hard mask layer 106 may be comprise silicon nitride and/or buffer insulation layer/silicon nitride.

The hard mask layer 106 and the substrate 100 are successively patterned to form a trench 108 at a predetermined region of the substrate 100. The trench 108 defines cell, low-voltage, and the high-voltage active regions in the cell, low-voltage, and high-voltage regions 50, 51 and 52, respectively.

A device isolation insulation layer filling the trench 108 is formed on a surface of the substrate 100. A device isolation layer 110 is formed by planarizing the device isolation insulation layer until the hard mask layer 106 is exposed. The device isolation layer 110 may comprise silicon oxide. The hard mask layer 106 is removed to expose the cell and low-voltage active regions, and the high-voltage gate insulation layer 104.

A low-voltage gate insulation layer 112 is formed on a surface of the exposed cell and low-voltage active regions by performing a second thermal oxidation process on the substrate 100. In this case, a thermal oxide layer may be formed on a surface of the high-voltage gate insulation layer 104. Finally, the high-voltage gate insulation layer 104 may be formed to a desired thickness by controlling an initial thickness, a recessed thickness in removing the oxidation barrier layer 102 and the hard mask layer 106 and, the thickness of a thermal oxide layer added in forming the low-voltage insulation layer 112.

A first gate conductive layer 114 is formed on a surface of a substrate 100 having the low-voltage and high-voltage gate insulation layers 112 and 104. The first gate conductive layer 114 may comprise a doped polysilicon and/or a conductive metal component. The conductive metal component may include a metal layer, such as tungsten, a conductive metal nitride layer, such as titanium nitride and/or a metal silicide, such as tungsten suicide.

The first gate conductive layer 114 and the low-voltage gate insulation layer 112 are patterned to expose the substrate 100 of the cell region 50. The cell active region may be exposed completely. The patterned first gate conductive layer 114 covers a predetermined region of the substrate 100 in the low-voltage and high-voltage regions 51 and 52.

Figure 5:
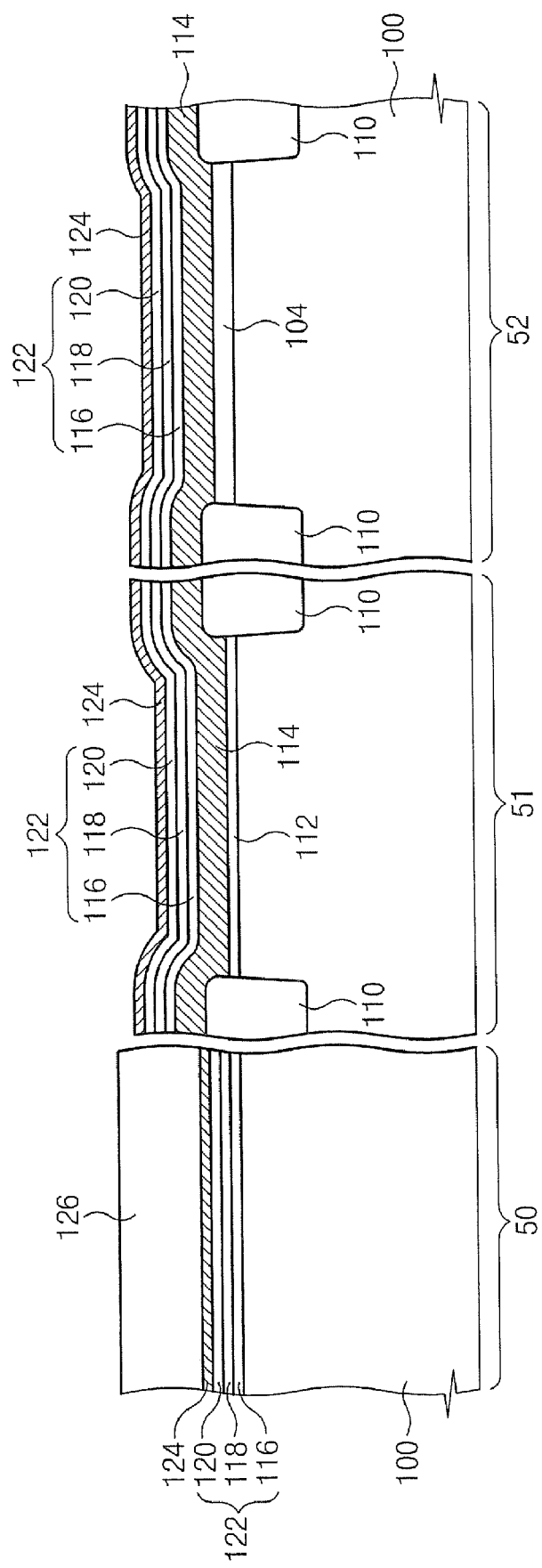
Figure 6:
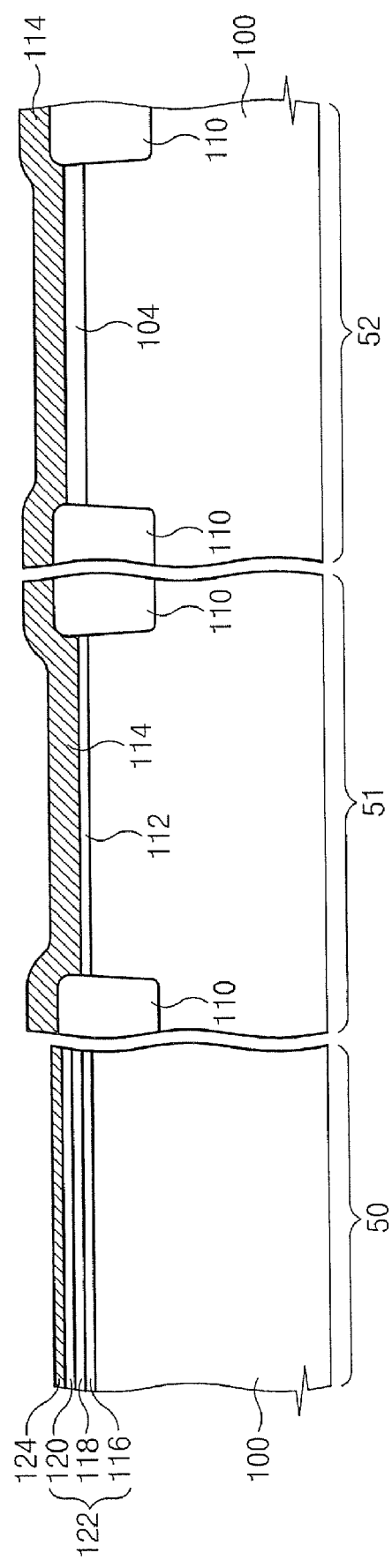

Referring now to FIGS. 5 and 6, a multi-layered charge storage layer 122 and a protection conductive layer 124 are sequentially formed on a surface of the exposed substrate 100. The multi-layered charge storage layer 122 comprises a tunnel insulation layer 116, a trap insulation layer 118, and a blocking insulation layer 120, which are stacked sequentially.

The tunnel insulation layer 116 may comprise silicon oxide. In some embodiments, the tunnel insulation layer 116 may comprise a thermal oxide layer. The trap insulation layer 118 comprises an insulation layer containing a multiplicity of deep level traps. For example, the trap insulation layer 118 may comprise silicon nitride and/or silicon oxynitride. The blocking insulation layer 120 may comprise a dielectric layer having a high dielectric constant in comparison with silicon oxide. For example, the blocking insulation layer 120 may comprise a metal oxide, such as aluminum oxide and/or hafnium oxide. In other embodiments, the blocking insulation layer 120 may comprise silicon oxide that is thicker than the tunnel insulation layer 116.

A photoresist pattern 126 is formed on the protection conductive layer 124. The photoresist pattern 126 covers the cell region 51, specifically, the cell active region. Accordingly, the protection conductive layer 124 that is formed at the low-voltage and high-voltage regions 51 and 52 is exposed.

The protection conductive layer 124 and the multi-layered charge storage layer 122 are etched using the photoresist pattern 126 as a etch mask to expose a predetermined region of the patterned first gate conductive layer 114. The exposed first gate conductive layer 114 is located in the low-voltage and high-voltage regions 51 and 52. The photoresist pattern 126 is removed by performing an ashing process. In a patterning process using the photoresist pattern 126, the protection conductive layer 124 may protect the multi-layered charge storage layer 122 of the cell region 50.

Figure 7:
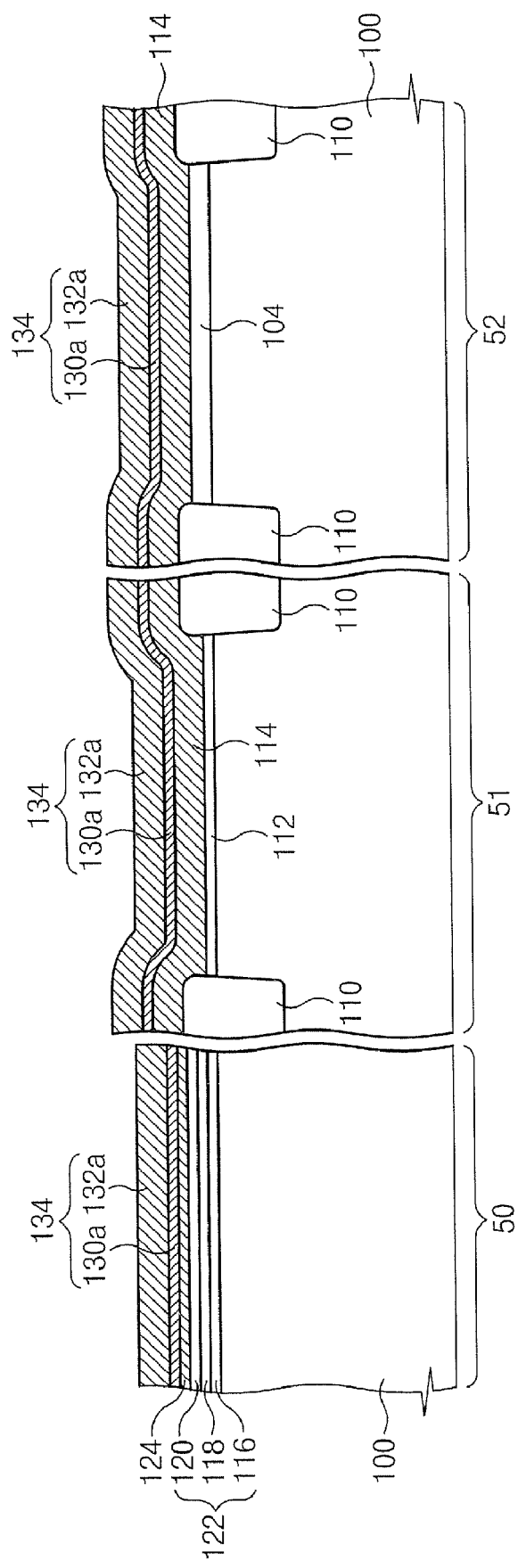

Referring now to FIGS. 7 and 8, a second gate conductive layer 134 is formed on the surface of a substrate 100 having the exposed first gate conductive layer 114. The second gate conductive layer 134 may comprise a subsidiary conductive layer 130 and a main conductive layer 132, which are stacked sequentially. In other embodiments, the second gate conducive layer 134 may comprise only the main conductive layer 132 without the subsidiary layer 130.

A conductive material may make direct contact with an upper surface of the blocking insulation layer 120, which comprises a high work function conductive material having a work function greater than n-type doped polysilicon. For example, the high work function conductive material may comprise a metal (e.g., tungsten, molybdenum etc.), a conductive metal nitride (e.g., titanium nitride, tantalum nitride, tungsten nitride or titanium aluminum nitride etc.) and/or a metal silicide (e.g., tungsten silicide etc.).

If the protection conductive layer 124 and the second gate conductive layer are sequentially formed on the blocking insulation layer 120, then at least the protection conductive layer 124 may comprise the high work function conductive material. The second gate conductive layer 134 may comprise the high work function conductive material either completely or in part, in accordance with various embodiments of the present invention. In other embodiments, the second gate conductive layer 134 may comprise doped polysilicon either completely or in part.

If the second conductive layer 134 is in direct contact with the blocking insulation layer 120 due to omission of the protection conductive layer 124, then at least a bottom portion of the second gate conductive layer 134 may comprise the high work function conductive material. If a second gate conductive layer 134 comprises the subsidiary and main conductive layers 130 and 132, then at least the subsidiary conductive layer 130 comprises the high work function conductive material. The main conductive layer 132 may comprise the high work function conductive material or doped polysilicon. If a second gate conductive layer 134 comprises only the main conductive layer 132, then the main conductive layer 132 may comprise the high work function conductive material.

The protection conductive layer 124 may comprise a material that inhibits etch damage to the multi-layered charge storage layer and has a work function greater than n-type doped polysilicon. For example, the protection conductive layer 124 may comprise tungsten nitride, tantalum nitride, and/or titanium nitride, etc. The main conductive layer 132 may comprise a metal layer, such as tungsten or molybdenum, which are capable of reducing gate resistance. The subsidiary conductive layer 130 may comprise a conductive metal nitride layer, such as titanium nitride, tantalum nitride, and/or tungsten nitride to improve the interface characteristic between the first and second gate conductive layers 114 and 134.

The second gate conductive layer 134, the protection layer 124, and the first gate conductive layer 114 are successively patterned to form a protection conductive pattern 124a and a cell gate electrode 134a, which are stacked sequentially at the cell region 50, a low-voltage gate electrode 136 of the low-voltage region 51, and a high-voltage gate electrode 138 of the high-voltage region 52. When the gate electrodes 134a, 136, and 138 are formed, the multi-layered charge storage layer 122, the low-voltage gate insulation layer 112, and the high-voltage gate insulation layer 104 may be successively etched.

The cell gate electrode 134a comprises a cell subsidiary conductive pattern 130a and a cell main conductive pattern 132a, which are stacked sequentially. The low-voltage gate electrode 136 comprises lower and upper low voltage gates 114a and 134b, which are stacked sequentially. The upper low-voltage gate 134b comprises a low-voltage subsidiary conductive pattern 130b and a low-voltage main conductive pattern 132b, which are stacked sequentially. The high-voltage gate electrode 138 comprises lower and upper high-voltage gates 114b and 134c, which are stacked sequentially. The upper high-voltage gate electrode 134c comprises a high-voltage subsidiary conductive pattern 130c and a high-voltage main conductive pattern 132c, which are stacked sequentially.

In FIG. 8, the multi-layered charge storage layer 122 and the gate insulation layers 112 and 104 align with sidewalls of the gate electrodes 134a, 136 and 138. In other embodiments (not shown), the multi-layered charge storage layer 122 may remain so that it may cover the cell active region at both sides of the cell gate electrode 134a. In the same way, the low-voltage gate insulation layer 112 may remain and cover the low-voltage active region at both sides of the low-voltage gate electrode 136. The high-voltage gate insulation layer 104 may remain and cover the high-voltage active region at both sides of the high-voltage gate electrode 138.

First, second, and third impurity diffusion regions 140a, 140b and 140c are formed by selectively implanting impurity ions. The first, second and third impurity diffusion regions 140a, 140b and 140c may be formed at the same time. In other embodiments, the first, second and third impurity diffusion regions 140a, 140b and 140c may be formed sequentially.

In other embodiments of the present invention, there is provided a NAND-type non-volatile memory device and a method of forming the same. Unit cells of the NAND-type non-volatile memory device may be disposed in a cell string shape. The cell string may include a string selection transistor for selecting the cell string, a ground selection transistor for selecting a source region, and a plurality of unit cells located between the string selection transistor and the ground selection transistor.

Figure 9A:
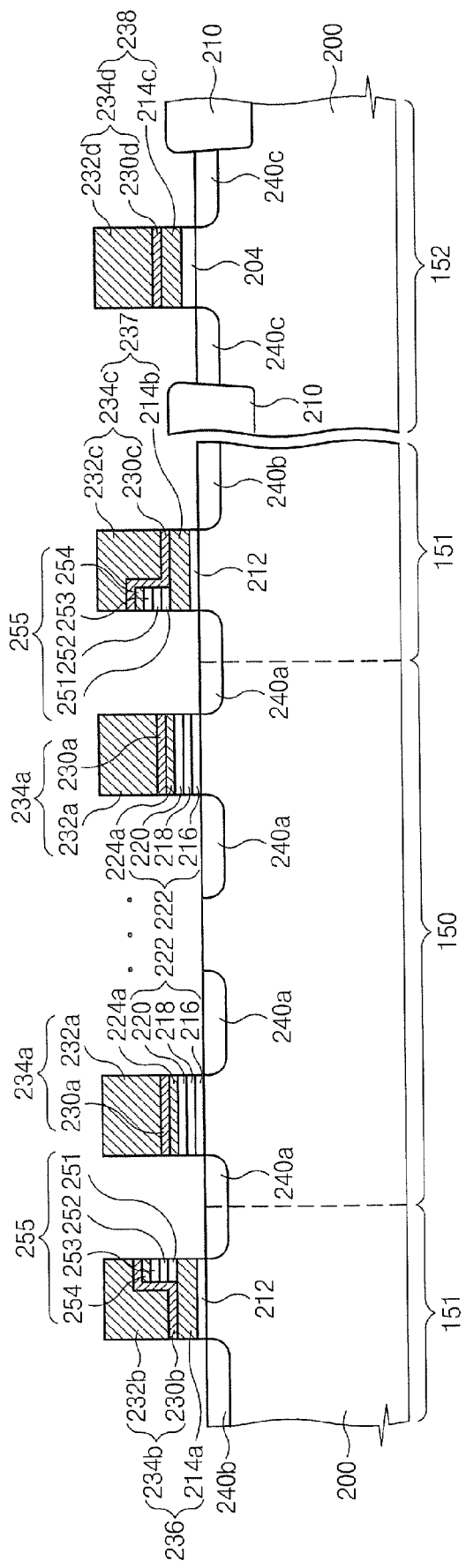
FIG. 9A is a cross-sectional view showing a non-volatile memory device according to further embodiments of the present invention.

FIG. 9A is a cross-sectional view showing a non-volatile memory device according to further embodiments of the present invention. Referring now to FIG. 9A, a device isolation layer 210 is disposed at a predetermined region of a substrate 200 having a first cell region 150, a second cell region 151, and a high-voltage region 152. A non-volatile memory cell is placed at the first cell region 150, a string selection transistor or a ground selection transistor is placed at the second cell region 151, and a high-voltage transistor is placed at the high-voltage region 152. A couple of second cell regions 151 are connected to both sides of the first cell region 150. The device isolation layer 210 defines a cell active region, a selection active region, and a high-voltage active region at the first cell region 150, the second cell region 151, and the high-voltage region 152, respectively. The cell active region and the selection active region are connected to each other thereby constituting a string active region.

A cell gate electrode 234a crosses over the cell active region. A plurality of parallel cell gate electrodes 234a may cross over the cell active region. A string selection gate electrode 236 crosses over the selection active region connected to one edge of the cell active region, and a ground selection gate electrode 237 crosses over the selection active region connected to the other edge of the cell active region. The string selection and the ground selection gate electrodes 236 and 237 are in parallel with the cell gate electrode 234a. A high-voltage gate electrode 238 crosses over the high-voltage active region.

A multi-layered charge storage layer 222 is interposed between the cell gate electrode 234a and the substrate 200. A selection gate insulation layer 212 is interposed between the string selection gate electrode 236 and the substrate 200, and between the ground selection gate electrode 237 and the substrate 200. A high-voltage gate insulation layer 204 is interposed between the high-voltage gate electrode 238 and the substrate 200.

The multi-layered charge storage layer 222 comprises a tunnel insulation layer 216, a trap insulation layer 218, and a blocking insulation layer 220, which are stacked sequentially. The tunnel insulation layer 216 may comprise silicon oxide, such as a thermal oxide layer. The trap insulation layer 218 may comprise an insulation layer having deep level traps, such as, for example, silicon nitride and/or silicon oxynitride. To increase a coupling ratio, the blocking insulation layer 220 may comprise a high dielectric layer having a high dielectric constant in comparison with silicon oxide, such as, for example, a metal oxide, such as aluminum oxide or hafnium oxide. In other embodiments, the blocking insulation layer 220 may comprise silicon oxide that is thicker than the tunnel insulation layer 216.

The selection gate insulation layer 212 and the high-voltage insulation layer 204 may comprise silicon oxide, such as a thermal oxide. The high-voltage gate insulation layer 204 is relatively thick as compared to the selection gate insulation layer 212. That is, the selection gate insulation layer 212 has a thickness suitable for the selection transistor's characteristic. The high-voltage gate insulation layer 204 has a thickness suitable for high-voltage transistor's characteristic. As a result, a non-volatile memory cell, string selection transistor, and ground selection transistor, and high-voltage transistors can be embodied in a suitable state for each wanted characteristic.

Referring to FIG. 9A, the cell gate electrode 234a may comprise a cell subsidiary conductive pattern 230a and a cell main conductive pattern 232a, which are stacked sequentially. In other embodiments, the cell gate electrode 234a may comprise only the cell main conductive pattern 232a without the cell subsidiary conductive pattern 230a. A protection conductive pattern 224a may be interposed between the cell gate electrode 234a and the multi-layered charge storage layer 222.

An upper surface of the blocking insulation layer 220 may be in contact with a high work function conductive material having a work function larger than n-type doped polysilicon. The high work function conductive material may be the same material as in the embodiments described above.

If the protection conductive pattern 224a and the cell gate electrode 234a are sequentially stacked on the multi-layered charge storage layer 222, then at least the protection conductive pattern 224a may comprise the high work function conductive material. In this case, the cell gate electrode 234a may comprise the high work function conductive material either completely or in part, in accordance with various embodiments of the present invention. In addition, the cell gate electrode 234a may be partially or completely formed using doped polysilicon.

If a cell gate electrode 234a comprising the cell subsidiary conductive pattern 230a and the cell main conductive pattern 232a is disposed on an upper surface of the multi-layered charge storage layer 222, then the cell subsidiary conductive pattern 230a may comprise the high work function conductive material. In this case, the cell main conductive pattern 232a may comprise doped polysilicon or the high work function conductive material.

If the cell gate electrode 234a comprising only the cell main conductive pattern 232a is formed on an upper surface of the multi-layered charge storage layer 222, then the cell main conductive pattern 232a may comprise the high work function conductive material.

The string selection gate electrode 236 comprises lower and upper string selection gates 214a and 234b, which are stacked sequentially. The ground selection gate electrode 237 comprises lower and upper ground selection gates 214b and 234c, which are stacked sequentially. The upper string selection gate 234b may comprise a string selection subsidiary conductive pattern 230b and a string selection main conductive pattern 232b, which are stacked sequentially. The upper ground selection gate 234c may comprise a ground selection subsidiary conductive pattern 230c and a string selection main conductive pattern 232c, which are stacked sequentially.

A residual multi-layered pattern 255 is interposed between one part of an upper surface of the lower string selection gate 214a and the upper string selection gate 234b. Another part of the upper surface of the lower string selection gate is electrically connected to the upper string selection gate 214a.

The residual multi-layered pattern 255 may comprise a material interposed between the cell gate electrode 234a and the substrate 200. In other words, if the multi-layered charge storage layer 222 and the protection conductive pattern 224a are interposed between the cell gate electrode 234a and the substrate 200, then the residual multi-layered pattern 255 comprises first, second, third, and fourth residual layers 251, 252, 253 and 254, which are stacked sequentially. The first, second, third and fourth residual layers 251, 252, 253 and 254 are formed of the same materials as the tunnel insulation layer 216, the trap insulation layer 218, the blocking insulation layer 220, and the protection conductive pattern 224a, respectively. If the protection conductive pattern 224a is omitted, then the residual multi-layered pattern 255 is formed of the same material as the multi-layered charge storage layer 222. That is, the residual multi-layered pattern 255 comprises only the first, second, and third residual layers 251, 252 and 253.

The residual multi-layered pattern 255 may be equivalent to an overlapped region for alignment margin of a photolithography process to form a non-volatile memory device. Namely, the residual multi-layered pattern 255 is interposed in a part of the string selection gate electrode 236, thereby decreasing an interval of the string selection gate electrodes 236 and the neighboring cell gate electrodes 234a. As a result, it is possible to provide a highly integrated non-volatile memory device.

As shown in FIG. 9A, an exposed sidewall of the residual multi-layered pattern 255 and sidewalls of the lower and upper string selection gates 214a and 234b disposed under and on the residual multi-layered pattern 254 may be disposed in the same vertical line with respect to a surface of the substrate 200. Sidewalls of lower and upper string selection gates opposite to the exposed sidewall of the residual multi-layered pattern 255 may be disposed in the same vertical line with respect to a surface of the substrate 200.

A residual multi-layered pattern 255 is interposed between a part of the upper surface of the lower ground selection gate 214b and the upper ground selection gate 234c. A residual multi-layered pattern 255 of the ground selection gate electrode 237 is formed of the same material as the residual multi-layered pattern 255 of the string selection gate electrode 236. The string selection and ground selection gate electrodes 236 and 237 are symmetric. Therefore, the residual multi-layered pattern 255 of the string selection gate electrode 236 and the residual multi-layered pattern 255 of the ground selection gate electrode 237 are symmetric.

The high-voltage gate electrode 238 comprises lower and upper high-voltage gates 214c and 234d, which are stacked sequentially. The upper high-voltage gate 234d may comprise a high-voltage subsidiary conductive pattern 230d and a high-voltage main conductive pattern 232d, which are stacked sequentially.

The cell gate electrode 234a, the upper string selection gate 234d, the upper ground selection gate 234c, and the upper high-voltage gate 234d are formed of the same materials. The cell, string selection, ground selection, and the high-voltage subsidiary conductive patterns 230a, 230b, 230c, and 230d are formed of the same materials, and the cell, string selection, ground selection, and high-voltage main conductive patterns 232a, 232b, 232c and 232d are formed of the same materials.

A first impurity diffusion region 240a is placed in the string active region at both sides of the cell gate electrode 234a. A second impurity diffusion region 240b is placed in the string active region at one side of the selection gate electrodes 236 and 237. A third impurity diffusion region 240c is placed in the high-voltage active region at both sides of the high-voltage gate electrode 238. The cell gate electrode 234a, the selection gate electrodes 236 and 237, and the first impurity diffusion regions 240a are located at the substrate 200 between a couple of the second impurity diffusion regions 240b. The second impurity diffusion region 240b at one side of the string selection gate electrode 236 may correspond to a string source region. The first and second impurity diffusion regions 240a and 240b may have the same impurity concentration. In other embodiments, the first and second impurity diffusion regions 240a and 240b may have different impurity concentrations. Furthermore, the first, second, and third impurity diffusion regions 240a, 240b, and 240c may have the same or different impurity concentrations.

In the non-volatile memory device with the above-structure, the non-volatile memory cell has a multi-layered charge storage layer 222. Selection transistors have a selection gate insulation layer 212 suitable for a desired characteristic of the selection transistors. In addition, the high-voltage transistor has a high-voltage gate insulation layer 204 that is thick enough for a high-voltage to be applied. Accordingly, the non-volatile memory cell, selection transistors, and high-voltage transistor may be suitable to a desired characteristic.

In addition, the residual multi-layered pattern 255 is interposed at a part of the selection gate electrodes 236 and 237. Depending on this, intervals between the selection gate electrodes 236 and 237 and the neighboring cell gate electrodes 234a may be decreased so that the non-volatile memory device can be more highly integrated.

Figure 9B:
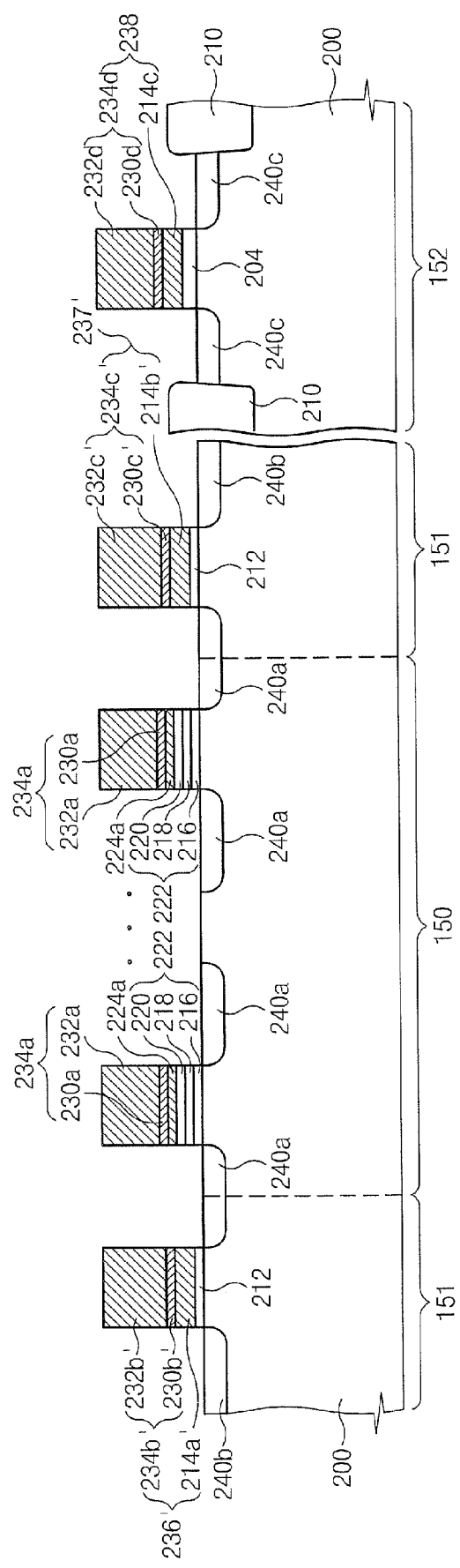
FIGS. 9B, 9C, and 9D, are cross sectional views that illustrate selection gate electrodes according to some embodiments of the present invention.
Figure 9C:
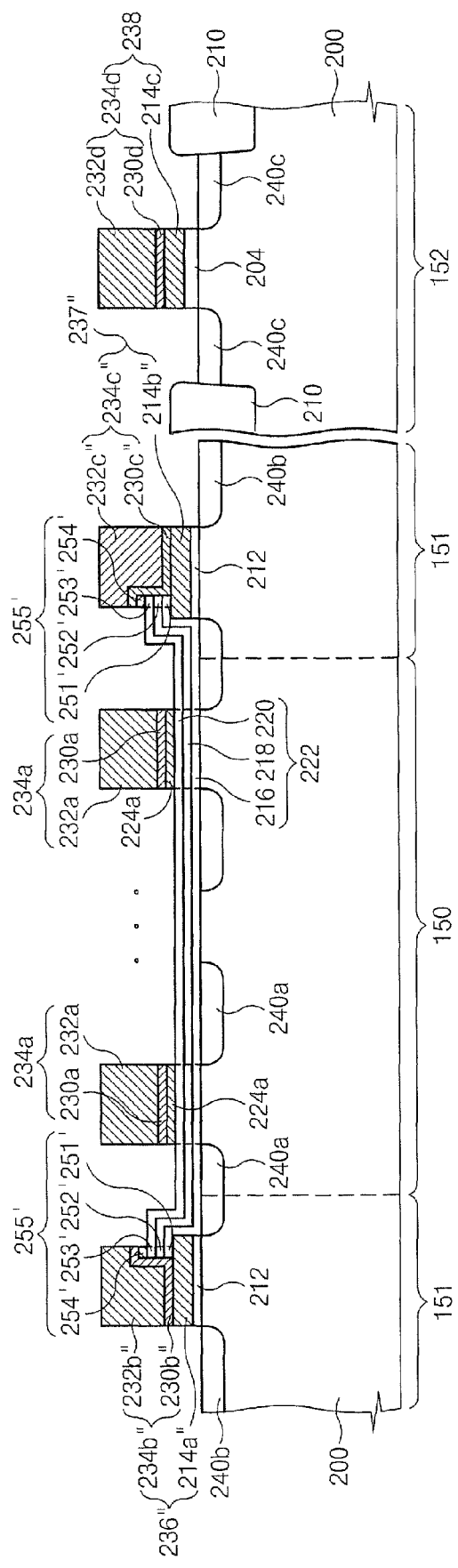
Figure 9D:
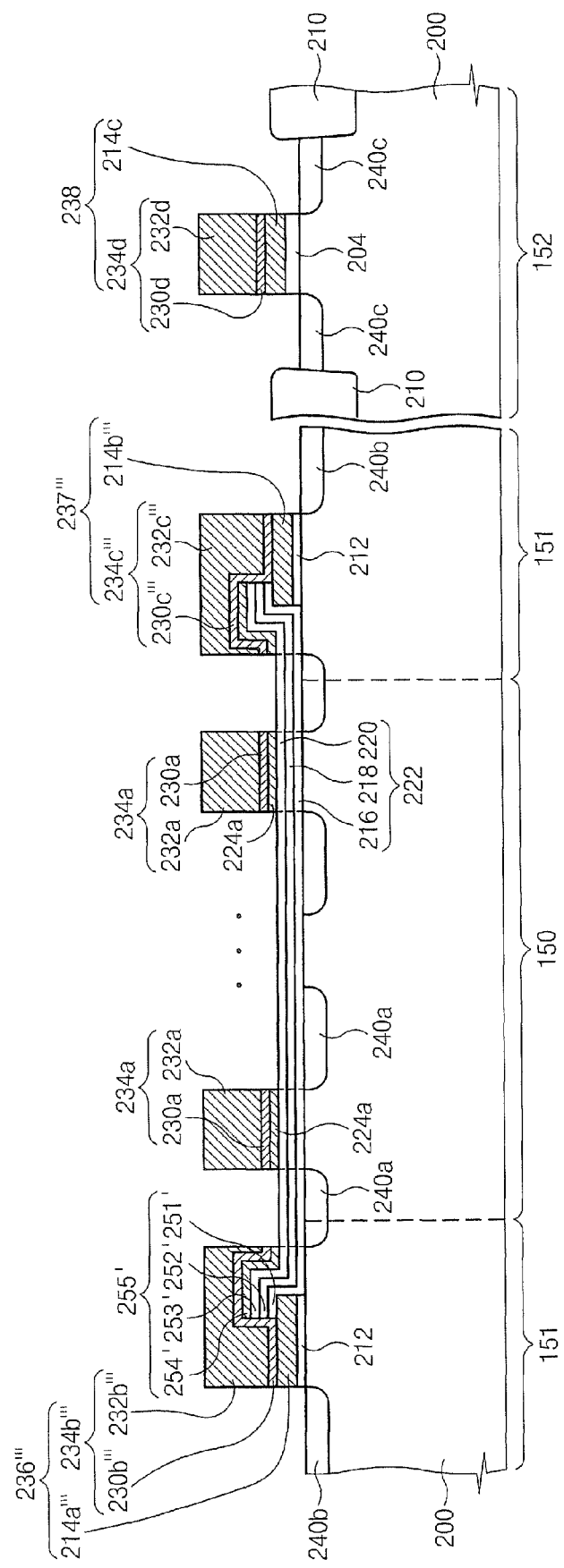
Figure 10:
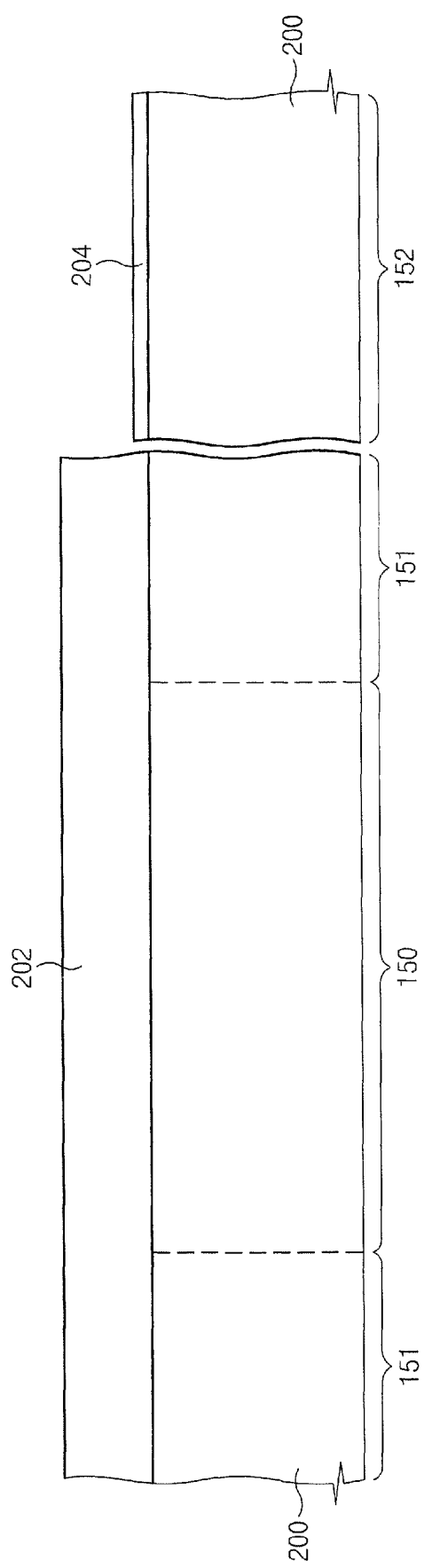
Figure 11:
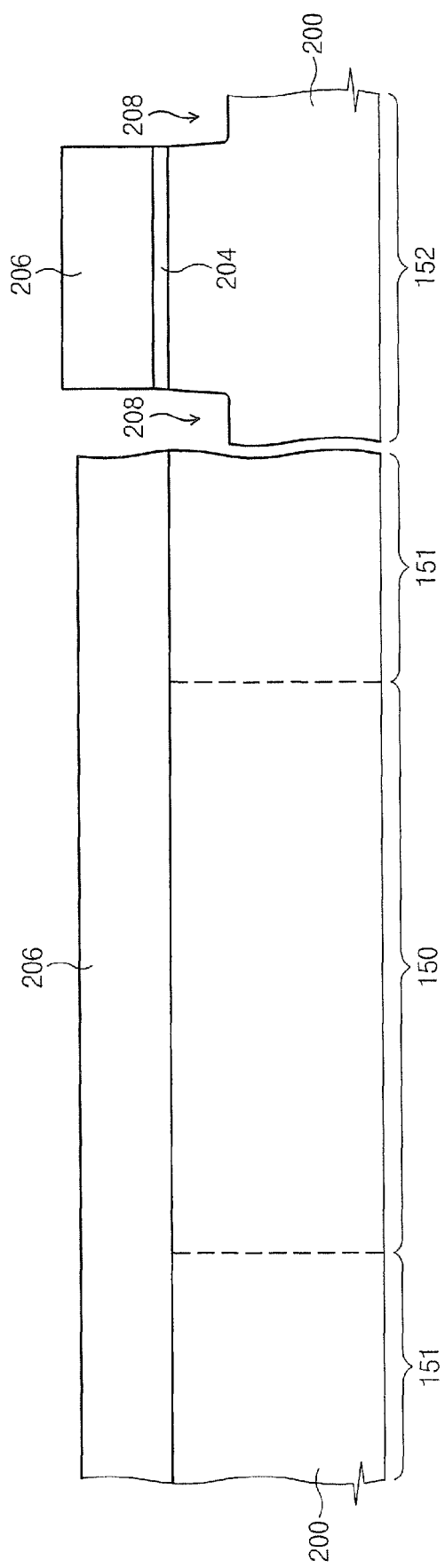

With reference to FIGS. 9B, 9C and 9D, the selection gate electrodes, in accordance with some embodiments of the present invention, will be described. FIG. 9B is a cross-sectional view that illustrates a non-volatile memory device according to further embodiments of the present invention. Referring to FIG. 9B, both sidewalls of the lower and upper string selection gates 214a' and 234b' are aligned with each other, respectively. In the same way, both sidewalls of the bottom and upper ground selection gates 214b' and 234c' are aligned with each other, respectively. In other words, a whole upper surface of the lower string selection gate 214' is in contact with the upper string selection gate 234b'. A whole upper surface of the lower ground selection gate 214b' is in contact with the upper ground selection gate 234c'. The residual multi-layered pattern 255 of FIG. 9A does not exist. Accordingly, a contact resistance between the lower and upper string selection gates 214a' and 234b' and between the lower and upper ground selection gates 214b' and 234c' can be reduced.

FIG. 9C is a cross-sectional view that illustrates a non-volatile memory device according to further embodiments of the present invention. Referring to FIG. 9C, the non-volatile memory device includes a residual multi-layered pattern 255'. One edge of the multi-layered charge storage layer 222 of a first cell region 150 is extended to be connected to first, second, and third residual layers 251', 252' and 253' of the residual multi-layered pattern 255'. If a protection conductive pattern 224a exists, one sidewall of a fourth residual layer 254' of the residual multi-layered pattern 255' is placed in the same vertical line as the sidewall of an upper string selection gate 234b''. That is, the protection conductive pattern 224a is separated from the fourth residual layer 254'.

Sidewalls of lower and upper string selection gates 214a'' and 234b'' disposed under and on the residual multi-layered pattern 255' are disposed on different vertical lines with respect to a surface of the substrate 200. In other embodiments, the other sidewalls of the lower and upper string selection gates 214a'' and 234b'' are placed in the same vertical line with respect to a surface of the substrate 200. A line width of the lower string selection gate 214a'' may be wider than that of the upper string selection gate 234b'.

A residual multi-layered pattern 255' is placed between the lower and the upper ground selection gates 214b' and 234c' of a ground selection gate electrode 237''. The lower and upper ground selection gates 214b" and 234c" are symmetric with respect to the lower and the upper string selection gates 214a" and 234b".

FIG. 9D is a cross-sectional view that illustrates a non-volatile memory device according to further embodiments of the present invention. Referring to FIG. 9D, a residual multi-layered pattern 255' may have the same form shown in FIG. 9C. That is, one edge of a multi-layered charge storage layer 222 is extended to be connected to the residual multi-layered pattern 255'. In addition, if a protection conductive pattern 224a exists, then a sidewall of a fourth residual layer 254' of the residual multi-layered pattern 255' and a sidewall of an upper string selection gate 234b''' (or an upper ground selection gate 234c''') disposed on the residual multi-layered pattern 255' are placed in the same vertical line with respect to a surface of the substrate 200. The protection conductive pattern 224a is also separated from the fourth residual layer 254'.

Sidewalls of lower and upper string selection gates 214a''' and 234b''' disposed under and on the residual multi-layered pattern 255' are placed in different vertical lines with respect to a surface of the substrate 200. The other sidewalls of the lower and upper string selection gates 214a''' and 234b''' are placed in the same vertical line with respect to a surface of the substrate 200. The line width of the upper string selection gate 234b''' is wider than that of the lower string selection gate 214a'''. Lower and upper ground selection gates 214b''' and 234c''' of a ground selection gate electrode 237''' are symmetric with respect to the lower and upper string selection gates 214a''' and 234b'''.

In other embodiments, the string selection and ground selection transistors of a NAND-type non-volatile memory device may correspond to the low-voltage transistor described above.

Furthermore, the NAND-type non-volatile memory device may further include a low-voltage region (not shown) for a low-voltage transistor (not shown) at a peripheral circuit of the NAND-type non-volatile memory device. In other words, the NAND-type non-volatile memory device has a cell array part and a peripheral circuit part. First and second cell regions 150 and 151 may be placed at the cell array part. The low-voltage region (not shown) and the high-voltage region 152 may be placed at the peripheral circuit part. In this case, a gate insulation layer of the low-voltage transistor (not shown) may have the same material and thickness as the selection gate insulation layer 212. In addition, a gate electrode of the low voltage-transistor (not shown) may have the same structure as the high-voltage gate electrode 238.

FIGS. 10 to 15 are sectional views illustrating formation of a non-volatile memory device according to further embodiments of the present invention. Referring now to FIGS. 10 to 15, an oxidation barrier layer 202 is formed on a whole surface of a substrate 200 having a first cell region 150, a second cell region 151, and a high-voltage region 152. Non-volatile memory cells are formed in the first cell region 150. A couple of second cell regions 151 are connected to both sides of the first cell region 150, respectively. A string selection transistor or a ground selection transistor is formed in the second cell region 151. A high-voltage transistor is formed in the high-voltage region 152.

The oxidation barrier layer 202 is selectively etched to expose a predetermined region of the substrate 200 in the high-voltage region 152. A high-voltage gate insulation layer 204 is formed on a surface of the exposed substrate by performing a first thermal oxidation process. The oxidation barrier layer 202 may comprise silicon nitride and/or silicon oxide/silicon nitride.

The oxidation barrier layer 202 is removed from a substrate having the high-voltage gate insulation layer 203. A hard mask layer 206 is formed on a surface of a substrate having the high-voltage gate insulation layer 204. The hard mask layer 206 and the substrate 200 are successively patterned to form a trench in the substrate 200. The hard mask layer 208 may comprise silicon nitride and/or silicon oxide/silicon nitride. The trench 208 defines a cell active region, a selection active region, and a high-voltage active region in the first cell region 150, the second cell region, and the high-voltage region 150, respectively. The cell active region and the selection active region are connected each other to constitute a string active region.

Figure 12:
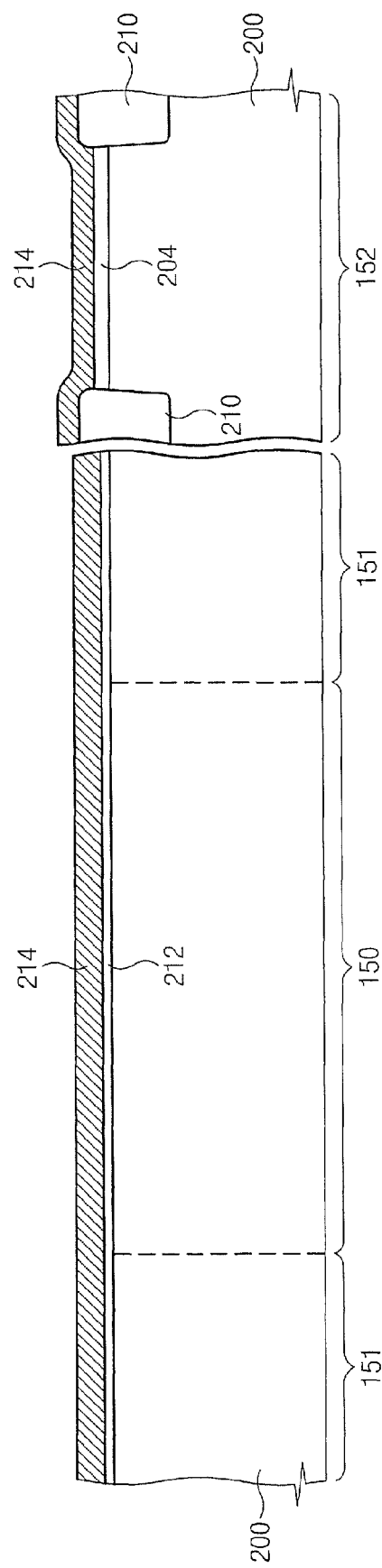
Figure 13:
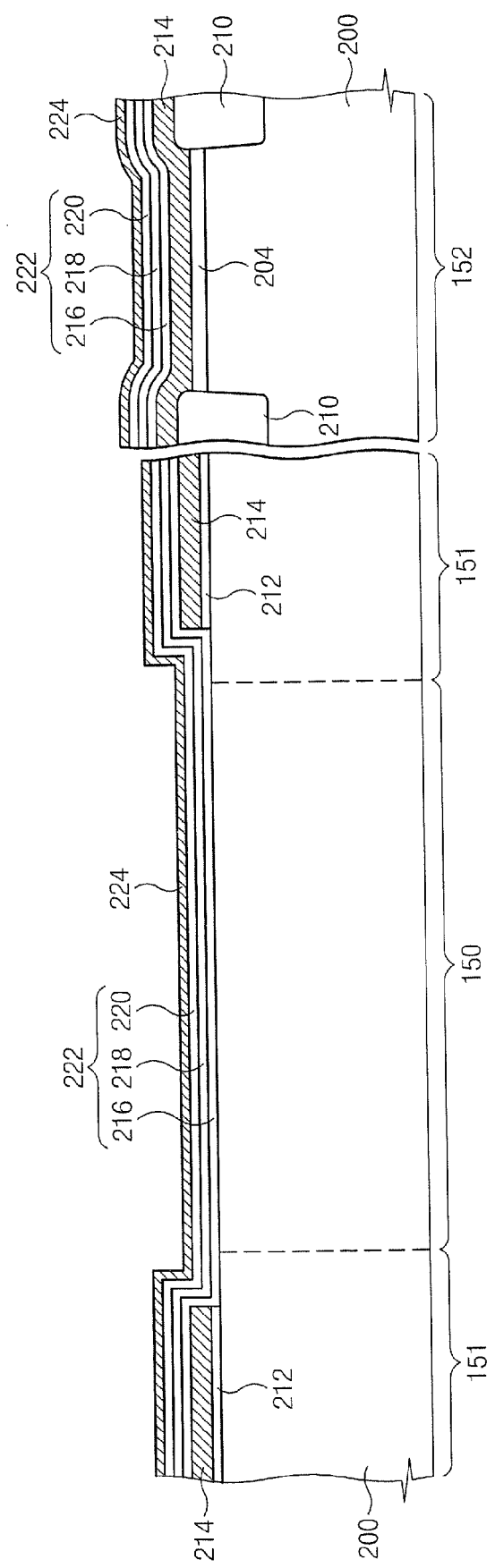

Referring to FIGS. 12 and 13, a device isolation insulation layer filling the trench 208 is formed on a whole surface of a substrate 200. The device isolation insulation layer is planarized until the hard mask layer 206 is exposed so that a device isolation layer 210 is formed. The hard mask layer 208 is removed to expose the string active region and the high-voltage gate insulation layer 204.

A selection gate insulation layer 211 is formed on the exposed string active region by performing a second thermal oxidation process. In some embodiments, the selection gate insulation layer 212 is thinner than the high-voltage gate insulation layer 204. During formation of the selection gate insulation layer 212, a thermal oxide layer may be formed on the high-voltage gate insulation layer 204. The thickness of the high-voltage gate insulation layer 204 may satisfy a desired target by controlling an initial thickness, a recessed thickness by removing the oxidation barrier layer 202 and the hard mask layer 206, and an added thickness by forming the selection gate insulation layer 212.

A first gate conductive layer 214 is formed on a surface of a substrate having the selection and high-voltage gate insulation layers 212 and 204. The first gate conductive layer 214 may be formed using doped polysilicon and/or a conductive metal component. The conductive metal component may be formed using the same materials as described above.

The first gate conductive layer 214 and the selection gate conductive layer 212 are successively patterned to expose a substrate 200 of the first cell region 150. That is, the cell active region is exposed. The patterned first gate conductive layer 214 covers a predetermined region of a substrate 200 of the high-voltage region 152 and the second cell region 151. A part of the selection active region neighboring the cell active region may be exposed. Advantageously, this may secure the alignment-margin of a photolithography process performed in a patterning process of the first gate conductive layer 214.

A multi-layered charge storage layer 222 and a protection conductive layer 224 are sequentially formed on a surface of a substrate having the exposed cell active region. The multi-layered charge storage layer 222 comprises a tunnel insulation layer 216, a trap insulation layer 218, and a blocking insulation layer 229, which are stacked sequentially. The tunnel insulation layer 216 may comprise silicon oxide, such as a thermal oxide layer. The trap insulation layer 218 may comprise an insulation layer containing deep level traps, such as silicon nitride or silicon oxynitride. The blocking insulation layer 220 may comprise a high dielectric layer having a high dielectric constant in comparison with silicon oxide, such as, for example, a metal oxide, such as aluminum oxide and/or hafnium oxide. The protection conductive layer 224 may perform a function to protect the blocking insulation layer 220. The protection conductive layer 224 may be omitted in some embodiments.

Figure 14:
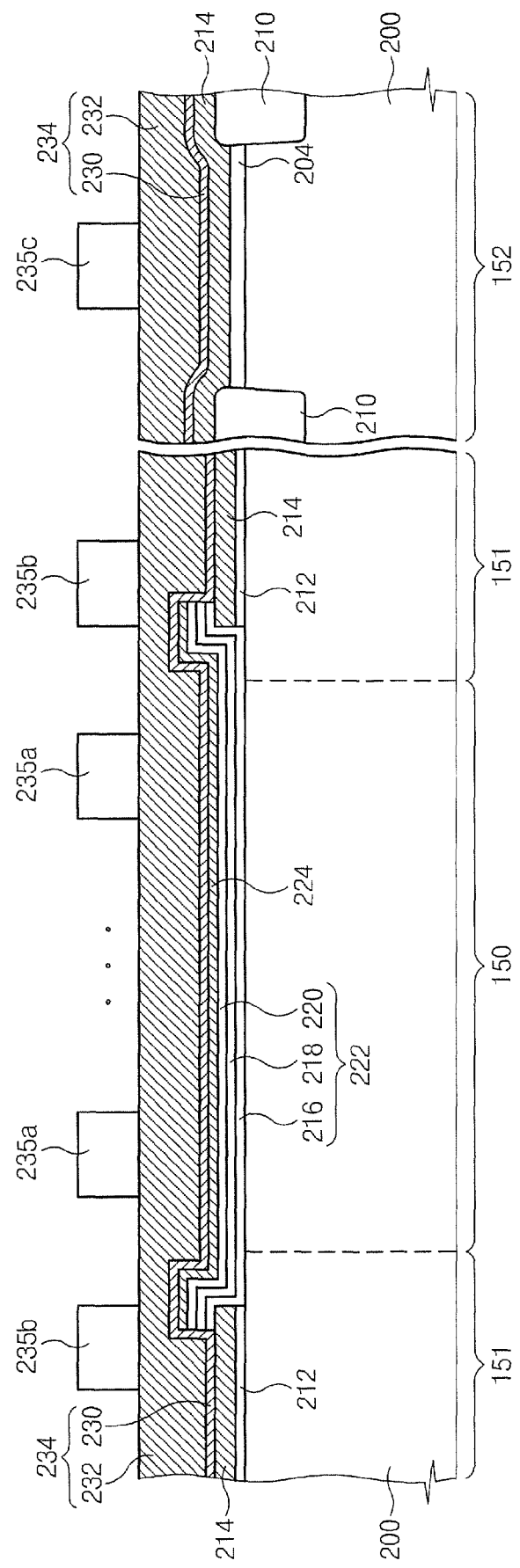

Referring now to FIGS. 14 and 15, the protection conductive layer 224 and the multi-layered charge storage layer 222 are patterned to expose a predetermined region of the patterned first gate conductive layer 214. The exposed first gate conductive layer 214 is located at the second cell region 151 and the high-voltage region 152. Both edges of the multi-layered charge storage layer 222 and the protection conductive layer 224 overlap with an edge of the patterned first gate conductive layer 214. This may secure the alignment-margin of a photolithography process between the patterned first gate conductive layer 214 and the patterned multi-layered charge storage layer 222.

A second gate conductive layer 234 is formed on a surface of a substrate 200 having the patterned multi-layered charge storage layer 222 and the protection conductive layer 224. The second gate conductive layer 234 may comprise a subsidiary conductive layer 230 and a main conductive layer 232, which are stacked sequentially. In other embodiments, the second gate conductive layer 234 may comprise only the main conductive layer 232 by omitting the subsidiary conductive layer 230. An upper surface of the second gate conductive layer 234 may be in a planarized state. In FIG. 14, the planarized upper surface of the second gate conductive layer 234 is shown.

In some embodiments, a conductive material may make direct contact with an upper surface of blocking insulation layer 220 and may comprise a high work function conductive material having a high work function in comparison with n-type doped polysilicon. The high work function conductive material may comprise the same material as discussed above. The protection conductive material 224 and the second gate conductive layer 234 may comprise various materials depending on the application in accordance with various embodiments of the present invention.

First, second, and third photoresist patterns 235a, 235b and 235c are formed by performing a photolithography process. The first photoresist pattern 235a is placed in the first cell region 150. A plurality of the first photoresist patterns 235a may be placed in the first cell region 150. The first photoresist pattern 235a may be placed in parallel. The second photoresist pattern 235b is placed in the second cell region 151, and the third photoresist pattern 235c is placed in the high-voltage region 152.

The second gate conductive layer 234, the protection conductive layer 224, the multi-layered charge storage 222, and the first gate conductive layer 214 are successively etched using the photoresist patterns 235a, 235b, and 235c as a mask to form a cell gate electrode 234a, a string selection gate electrode 236, a ground selection gate electrode 237, and a high-voltage gate electrode 238. The photoresist patterns 235a, 235b and 235c are removed by an ashing process.

The cell gate electrode 234a may comprise a cell subsidiary conductive pattern 230a and a cell main conductive pattern 232a, which are stacked sequentially. The string selection gate electrode 236 may comprise lower and upper selection gates 214a and 234b, which are stacked sequentially. The upper string selection gate 234b may comprise a string subsidiary conductive pattern 230b and a string selection main conductive pattern 232b, which are stacked sequentially. The ground selection gate electrode 237 comprises lower and upper selection gates 214b and 234c, which are stacked sequentially. The upper ground selection gate 234c comprises a ground selection subsidiary conductive pattern 230c and a ground selection main conductive pattern 232c, which are stacked sequentially. The high-voltage gate 234d comprises lower and upper high-voltage gates 214c and 234d, which are stacked sequentially. The upper high-voltage gate 234d may comprise a high-voltage subsidiary conductive pattern 230d and a high-voltage main conductive pattern 232d, which are stacked sequentially.

A residual multi-layered pattern 255 is formed between a part of the lower string selection gate 214a and the upper string gate selection gate 234b. The residual multi-layered pattern may be formed to have aligned sidewalls on one sidewall of the string selection gate electrode 236.

The residual multi-layered pattern 255 corresponds to a portion of the patterned multi-layered charge storage layer 222 and the protection conductive layer 224, which are shown in FIG. 14. That is, the residual multi-layered pattern 255 comprises first, second, third, and fourth residual layers 251, 252, 253 and 254, which are stacked sequentially. The first, second, third and fourth residual layers 251, 252, 253, and 254 correspond to portions of the patterned tunnel insulation layer 216, trap insulation layer 218, blocking insulation layer 220, and protection conductive layer 224, which are shown in FIG. 14, respectively.

In forming the gate electrodes 234a, 236, 237, and 238, the residual multi-layered pattern 255 is formed. Accordingly, an interval between the string selection gate electrodes 236 and the neighboring cell gate electrode 234a may become narrow. In other words, one edge of the second photoresist pattern 235b is overlapped at an overlapped portion of the patterned multi-layered charge storage layer 222 and the patterned first gate conductive layer 214 shown in FIG. 14. As a result, it is possible to secure an alignment-margin for a photolithography process for forming the second photoresist pattern 235b. At the same time, a non-volatile memory device may be more highly integrated by decreasing the interval between the second photoresist pattern 235b and the neighboring first photoresist pattern 235a.

In the same way, a residual multi-layered pattern 255 may be interposed between a part of the upper surface of the lower ground selection gate electrode 214b and the upper ground selection gate electrode 234c. The residual multi-layered pattern 255 of the string selection gate electrode 236 is symmetric with the residual multi-layered pattern 255 of the ground selection gate electrode 237.

The first, second, third, and fourth impurity diffusion regions 240a, 240b and 240c, which are shown in FIG. 9A, are formed by selectively implanting impurity ions. The first and second impurity diffusion regions 240a and 240b may be formed sequentially or simultaneously. Furthermore, the first, second and third impurity diffusion regions 240a, 240b and 240c may be formed sequentially or simultaneously.

Methods of forming the non-volatile memory device shown in FIGS. 9B, 9C, and 9D, in accordance with some embodiments of the present invention, are similar to that of the non-volatile memory device described with reference to FIGS. 10 to 15. The non-volatile memory device in FIG. 9B may be embodied by forming the second photoresist pattern 235b in FIG. 14 over an overlapped portion of only the patterned first gate conductive layer 214 and second gate conductive layer 234, which are located in a second cell region 151.

In the non-volatile memory device in FIG. 9C, referring to FIGS. 14 and 9C, one edge of the patterned first conductive layer 214 of FIG. 14 is formed to be sufficiently separated from a first cell region 150. The reason for this is to secure a first impurity diffusion region 240a between the gate electrodes 236" and 237" and the neighboring cell gate electrode 234a. One edge of the second photoresist pattern 235b of FIG. 14 is formed over the overlapped portion of the patterned charge storage layer 222 and the first gate conductive layer 214. Then, the second gate conductive layer 234, the protection conductive layer 224, and the patterned first gate conductive layer 214, which are shown in FIG. 14, are successively etched. The patterned multi-layered charge storage layer 222 of FIG. 14 is used as an etch stop layer.

In the non-volatile memory device in FIG. 9D, one edge of the patterned first gate conductive layer 214 in FIG. 14 is formed to be sufficiently separated from the first cell region 150. In some embodiments, the separated interval is wider than that of FIG. 9C. The reason for this is to secure a region as a first impurity diffusion region 240a and portions of the upper selection gate electrodes 234b''' and 234c'''. After that, one edge of the second photoresist pattern 235b in FIG. 14 is formed to be extended over the patterned charge storage layer 222, which is in contact with a string active region. Then, the second gate conductive layer 234, the protection conductive layer 222, and the patterned first gate conductive layer 214, which are shown in FIG. 14, are successively etched. At this time, the patterned first multi-layered charge storage layer 222 of FIG. 14 is used as an etch stop layer.

As discussed above, a memory cell of a non-volatile memory device includes a multi-layered charge storage layer having a tunnel insulation layer, a trap insulation layer and a blocking insulation layer. In addition, low-voltage or high-voltage transistors of the non-volatile memory device include gate insulation layers that may have a desired characteristic. As a result, the non-volatile memory device can have suitable memory cells and predetermined transistors.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A non-volatile memory device, comprising:
a substrate having a first region and a second region;
a first gate electrode crossing over a first active region in the first region;
a multi-layered charge storage layer interposed between the first gate electrode and the first active region, the multi-layered charge storage comprising a tunnel insulation, a trap insulation, and a blocking insulation layer which are sequentially stacked;
a second gate electrode crossing over a second active region in the second region, the second gate electrode comprising a lower gate and an upper gate, the upper gate being directly connected to at least a portion of an upper surface of the lower gate; and
a gate insulation layer interposed between the second gate electrode and the second active region;
wherein the first gate electrode and the upper gate of the second gate electrode comprise a same material.

2. The non-volatile memory device of claim 1, further comprising:
a residual multi-layered pattern interposed between a part of an upper surface of the lower gate of the second gate electrode and the upper gate of the second gate electrode;
wherein the residual multi-layered pattern comprises a same material as that interposed between the first gate electrode and the substrate.

3. The non-volatile memory device of claim 2, wherein sidewalls of the lower gate and the upper gate of the second gate electrode, respectively disposed under and on the residual multi-layered pattern, are placed on the same line vertical to a surface of the substrate.

4. The non-volatile memory device of claim 2, wherein sidewalls of the lower gate and the upper gate of the second gate electrode, respectively disposed under and on the residual multi-layered pattern, are disposed on different vertical lines with respect to a surface of the substrate; and
wherein the multi-layered charge storage layer extends along the substrate to be connected to the residual multi-layered pattern.

5. The non-volatile memory device of claim 2, further comprising:
a protection conductive pattern interposed between the first gate electrode and the multi-layered charge storage layer;
wherein the residual multi-layered pattern comprises a residual layer comprising a same material as the protection conductive pattern and being isolated from the protection conductive pattern; and
wherein the protection conductive pattern comprises a conductive material having a work function greater than n-type doped polysilicon.

6. A non-volatile memory device, comprising:
a substrate having a first cell region, a second cell region connected to one side of the first cell region, and a high-voltage region;
a cell gate electrode placed on the first cell region;
a multi-layered charge storage layer interposed between the cell gate electrode and the substrate and comprising a tunnel insulation layer, a trap insulation layer, and a blocking insulation layer;
a selection gate electrode placed on the second cell region and comprising a lower selection gate and an upper selection gate connected to an upper region of the lower selection gate;
a residual multi-layered pattern interposed between a part of an upper surface of the lower selection gate and the upper selection gate, the residual multi-layered pattern comprising a same material as that interposed between the cell gate electrode and the substrate;
a selection gate insulation layer interposed between the selection gate electrode and the substrate;
a high-voltage gate electrode placed on the high-voltage region and comprising a lower high-voltage gate and an upper high-voltage gate, which are stacked sequentially; and
a high-voltage gate electrode insulation layer interposed between the high-voltage gate electrode and the substrate and having a thickness greater than a thickness of the selection gate insulation layer;
wherein the lower selection gate and the lower high-voltage gate comprise a same material, and
wherein the cell gate electrode, the upper gate selection gate, and the upper high-voltage gate comprise a same material.

7. The non-volatile memory device of claim 6, wherein the multi-layered charge storage layer extends along the substrate and is connected to the residual multi-layered pattern.

8. The non-volatile memory device of claim 6, further comprising:
a protection conductive pattern interposed between the cell gate electrode and the multi-layered charge storage layer;
wherein the residual multi-layered pattern comprises a residual layer comprising a same material as the protection conductive pattern and being isolated from the protection conductive pattern; and wherein the protection conductive pattern comprises a material having a work function greater than n-type doped polysilicon.

9. A non-volatile memory device, comprising:
a substrate having a first region and a second region;
a first gate electrode crossing over a first active region in the first region;
a multi-layered charge storage layer interposed between the first gate electrode and the first active region, the multi-layered charge storage comprising a tunnel insulation, a trap insulation, and a blocking insulation layer which are sequentially stacked;
a second gate electrode crossing over a second active region in the second region, the second gate electrode comprising a lower gate and an upper gate connected to a region of an upper surface of the lower gate;
a gate insulation layer interposed between the second gate electrode and the second active region;
wherein the first gate electrode and the upper gate of the second gate electrode comprise a same material; and
a residual multi-layered pattern interposed between a part of an upper surface of the lower gate of the second gate electrode and the upper gate of the second gate electrode;
wherein the residual multi-layered pattern comprises a same material as that interposed between the first gate electrode and the substrate.

10. The non-volatile memory device of claim 9, wherein sidewalls of the lower gate and the upper gate of the second gate electrode, respectively disposed under and on the residual multi-layered pattern, are placed on the same line vertical to a surface of the substrate.

11. The non-volatile memory device of claim 9, wherein sidewalls of the lower gate and the upper gate of the second gate electrode, respectively disposed under and on the residual multi-layered pattern, are disposed on different vertical lines with respect to a surface of the substrate; and
wherein the multi-layered charge storage layer extends along the substrate to be connected to the residual multi-layered pattern.

12. The non-volatile memory device of claim 9, further comprising:
a protection conductive pattern interposed between the first gate electrode and the multi-layered charge storage layer;
wherein the residual multi-layered pattern comprises a residual layer comprising a same material as the protection conductive pattern and being isolated from the protection conductive pattern; and
wherein the protection conductive pattern comprises a conductive material having a work function greater than n-type doped polysilicon.

13. The non-volatile memory device of claim 1, wherein the first and second regions are cell and peripheral regions, respectively;
wherein the first gate electrode comprises a cell subsidiary conductive pattern and a cell main conductive pattern on the cell subsidiary conductive pattern;
wherein the upper gate of the second gate electrode comprises a peripheral subsidiary conductive pattern and a peripheral main conductive pattern on the peripheral subsidiary conductive pattern; and
wherein the cell subsidiary conductive pattern and the peripheral subsidiary conductive pattern comprises a same material.

14. The non-volatile memory device of claim 13, wherein the cell subsidiary conductive pattern and the peripheral subsidiary conductive pattern comprises a conductive material having a work function greater than n-type doped poly silicon.

15. The non-volatile memory device of claim 13, wherein the cell subsidiary conductive pattern is provided during the same process as peripheral subsidiary conductive pattern.

16. The non-volatile memory device of claim 1, wherein the first and second regions are cell and peripheral regions, respectively; and
wherein the first gate electrode and the upper gate of the second gate electrode comprises a conductive material having a work function greater than n-type doped poly silicon.

17. The non-volatile memory device of claim 6, wherein the cell gate electrode comprises a cell subsidiary conductive pattern and a cell main conductive pattern on the cell subsidiary conductive pattern;
wherein the upper high-voltage gate of the high-voltage gate electrode comprises a high-voltage subsidiary conductive pattern and a high-voltage main conductive pattern on the high-voltage subsidiary conductive pattern; and
wherein the cell subsidiary conductive pattern and the high-voltage subsidiary conductive pattern comprises a conductive material having a work function greater than n-type doped poly silicon.

18. The non-volatile memory device of claim 17, wherein the upper selection gate of the selection gate electrode comprise a selection subsidiary conductive pattern and a selection main conductive pattern on the selection subsidiary conductive pattern; and
wherein the selection subsidiary conductive pattern comprises the conductive material.

* * * * *